(12) United States Patent
Kim et al.

(10) Patent No.: US 11,482,179 B2
(45) Date of Patent: Oct. 25, 2022

(54) GATE DRIVER CIRCUIT AND DISPLAY DEVICE INCLUDING THE SAME

(71) Applicant: LG DISPLAY CO., LTD., Seoul (KR)

(72) Inventors: Kwangsoo Kim, Seoul (KR); Yongho Kim, Seoul (KR); Minkyu Chang, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/557,122

(22) Filed: Dec. 21, 2021

(65) Prior Publication Data

US 2022/0208112 A1 Jun. 30, 2022

(30) Foreign Application Priority Data

Dec. 24, 2020 (KR) .......................... 10-2020-0183752

(51) Int. Cl.
*G09G 3/3266* (2016.01)

(52) U.S. Cl.
CPC ... *G09G 3/3266* (2013.01); *G09G 2300/0842* (2013.01); *G09G 2310/08* (2013.01); *G09G 2320/0214* (2013.01)

(58) Field of Classification Search
None
See application file for complete search history.

(56) References Cited

U.S. PATENT DOCUMENTS

| 8,724,771 | B2 | 5/2014 | Jang | |
|---|---|---|---|---|
| 8,842,803 | B2 | 9/2014 | Jang | |
| 10,997,925 | B2 * | 5/2021 | Choi | G09G 3/3291 |
| 2018/0337682 | A1 * | 11/2018 | Takasugi | H03K 21/18 |
| 2019/0103049 | A1 * | 4/2019 | Noh | G09G 3/3677 |
| 2019/0108809 | A1 | 4/2019 | Zheng et al. | |
| 2019/0130848 | A1 * | 5/2019 | Kim | G09G 3/3266 |
| 2019/0164478 | A1 * | 5/2019 | Kim | G09G 3/3233 |
| 2020/0135115 | A1 * | 4/2020 | Chang | G09G 3/3266 |
| 2021/0201767 | A1 * | 7/2021 | Park | G09G 3/3233 |
| 2021/0201770 | A1 * | 7/2021 | Park | G11C 19/28 |
| 2021/0201814 | A1 * | 7/2021 | Choi | G09G 3/3266 |
| 2021/0201816 | A1 * | 7/2021 | Kim | G09G 3/3266 |
| 2022/0189407 | A1 * | 6/2022 | Choi | G09G 3/3266 |

FOREIGN PATENT DOCUMENTS

| KR | 2014-0020391 A | 2/2014 |
|---|---|---|
| KR | 2014-0042282 A | 4/2014 |

OTHER PUBLICATIONS

GB Office Action dated June 9, 2022 issued in Patent Application No. GB2118542.6 (6 pages).

* cited by examiner

*Primary Examiner* — Christopher J Kohlman
(74) *Attorney, Agent, or Firm* — Polsinelli PC

(57) ABSTRACT

A gate driver circuit includes a plurality of stage circuits, each stage circuit supplies a gate signal to each of gate lines arranged in a display panel and includes a M node, a Q node, a QH node, and a QB node, and each stage circuit includes a line selector, a Q node controller, a Q node and QH node stabilizer, an inverter, a QB node stabilizer, a carry signal output module, and a gate signal output module, and a high voltage level period of a carry clock signal is set not to overlap with a high voltage level period of a first scan clock signal.

17 Claims, 10 Drawing Sheets

GATE DRIVER CIRCUIT AND DISPLAY DEVICE INCLUDING THE SAME

CROSS-REFERENCE TO RELATED APPLICATION

This application claims the priority of Korean Patent Application No. 10-2020-0183752, filed on Dec. 24, 2020, which is hereby incorporated by reference in its entirety.

BACKGROUND

Field of the Disclosure

The present disclosure relates to a gate driver circuit and a display device including the same. More particularly, the present disclosure relates to a gate driver circuit and a display device including the same, in which an output difference between gate signals is reduced.

Description of the Background

A display device using a flat display panel such as a liquid crystal display device, an organic light-emitting display diode device, a light-emissive diode display device, and an electrical electrophoretic display device has been widely used.

The display device includes a pixel having a light-emissive element and a pixel circuit for driving the light-emissive element. For example, the pixel circuit includes a driving transistor that controls a driving current flowing through the light-emissive element, and at least one switching transistor that controls (or programs) a gate-source voltage of the driving transistor according to a gate signal. The switching transistor of the pixel circuit may be switched based on the gate signal output from a gate driver circuit disposed on a substrate of a display panel.

When an image is displayed on the display device, the gate signal for turning on the switching transistor is sequentially applied to gate lines of the display panel. When the switching transistor of a sub-pixel included in each line is turned on based on the gate signal, a data voltage is supplied to each sub-pixel such that light emits to display the image.

The display panel included in the display device includes a plurality of gate lines, a plurality of data lines, and sub-pixels arranged at intersection areas between the data lines and the gate lines. When an image is displayed through the display panel, a gate signal for turning on a switching transistor is sequentially supplied to each gate line. When the switching transistor of the sub-pixel included in each line is turned on based on the gate signal, a data voltage is supplied to each sub-pixel so that light emits to display the image.

When an output difference between gate signals respectively supplied to the gate lines occurs, that is, magnitudes and time durations of voltages of the gate signals respectively supplied to the gate lines are not uniform, magnitudes of data voltages supplied to the sub-pixels respectively based on different gate lines can be different from one another.

As a result, when an image is displayed through the display device, an output difference between lines can occur or an image of a specific line can be significantly different from an image of other lines. Thus, an image display quality of the display device can be deteriorated, and the output difference between the gate signals output from the gate driver circuit needs to be reduced.

SUMMARY

Accordingly, the present disclosure is directed to a gate driver circuit and a display device including the same that substantially obviate one or more of problems due to limitations and disadvantages of the above mentioned.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to improve an image display quality of a display device by reducing an output difference between gate signals output from the gate driver circuit.

The present disclosure is not limited to the above-mentioned purpose. Other features and advantages according to the present disclosure that are not mentioned may be understood based on following descriptions, and may be more clearly understood based on aspects according to the present disclosure. Further, it will be easily understood that the features and advantages according to the present disclosure may be realized shown in the claims and combinations thereof.

A gate driver circuit according to one aspect of the present disclosure may supply a gate signal to each gate line and may include a plurality of stage circuits, each including an M node, a Q node, a QH node, and a QB node.

In one aspect of the present disclosure, each stage circuit includes a line selector, a Q node controller, a Q node and QH node stabilizer, an inverter, a QB node stabilizer, a carry signal output module, a gate signal output module, and a Q node bootstrapper.

In response to an input of a line sensing preparation signal, the line selector charges the M node based on a front carry signal. In response to an input of a reset signal, the line selector charges the Q node to a first high-potential voltage level. In response to an input of a panel on signal, the line selector discharges the Q node to a third low-potential voltage level.

In response to an input of the front carry signal, the Q node controller charges the Q node to the first high-potential voltage level. In response to an input of a rear carry signal, the Q node controller discharges the Q node to the third low-potential voltage level.

The Q node and QH node stabilizers discharge the Q node and the QH node to the third low-potential voltage level when the QB node has been charged to a second high-potential voltage level.

The inverter changes a voltage level of the QB node based on a voltage level of the Q node.

The QB node stabilizer discharges the QB node to the third low-potential voltage level in response to an input of the rear carry signal, to an input of the reset signal, and to a charged voltage of the M node.

The carry signal output module outputs a carry signal based on a carry clock signal or the third low-potential voltage, according to a voltage level of the Q node or a voltage level of the QB node.

The gate signal output module outputs first to j-th gate signals based on first to j-th scan clock signals or a first low-potential voltage, according to a voltage level of the Q node or a voltage level of the QB node.

In one aspect of the present disclosure, a high voltage level period of the carry clock signal is set not to overlap with a high voltage level period of the first scan clock signal.

Further, a display device according to one aspect of the present disclosure includes a display panel including sub-pixels respectively disposed at intersections between gate lines and data lines, a gate driver circuit for supplying a scan signal to each gate line, a data driver circuit for supplying a data voltage to each data line, and a timing controller that controls an operation timing of each of the gate driver circuit and the data driver circuit.

In one aspect of the present disclosure, the gate driver circuit may supply a gate signal to each gate line and may include a plurality of stage circuits, each including an M node, a Q node, a QH node, and a QB node.

In one aspect of the present disclosure, each stage circuit includes a line selector, a Q node controller, a Q node and QH node stabilizer, an inverter, a QB node stabilizer, a carry signal output module, a gate signal output module, and a Q node bootstrapper.

In response to an input of a line sensing preparation signal, the line selector charges the M node based on a front carry signal. In response to an input of a reset signal, the line selector charges the Q node to a first high-potential voltage level. In response to an input of a panel on signal, the line selector discharges the Q node to a third low-potential voltage level.

In response to an input of the front carry signal, the Q node controller charges the Q node to the first high-potential voltage level. In response to an input of a rear carry signal, the Q node controller discharges the Q node to the third low-potential voltage level.

The Q node and QH node stabilizers discharge the Q node and the QH node to the third low-potential voltage level when the QB node has been charged to a second high-potential voltage level.

The inverter changes a voltage level of the QB node based on a voltage level of the Q node.

The QB node stabilizer discharges the QB node to the third low-potential voltage level in response to an input of the rear carry signal, to an input of the reset signal, and to a charged voltage of the M node.

The carry signal output module outputs a carry signal based on a carry clock signal or the third low-potential voltage, according to a voltage level of the Q node or a voltage level of the QB node.

The gate signal output module outputs first to j-th gate signals based on first to j-th scan clock signals or a first low-potential voltage, according to a voltage level of the Q node or a voltage level of the QB node.

In one aspect of the present disclosure, a high voltage level period of the carry clock signal is set not to overlap with a high voltage level period of the first scan clock signal.

According to one aspect of the present disclosure, the output difference between the gate signals output from the gate driver circuit is reduced. More specifically, an output difference between first and j-th gate signals among the j gate signals output from the stage circuit may be reduced. Thus, the output difference between the gate signals output from the gate driver circuit may be reduced. Therefore, the image display quality of the display device is improved.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
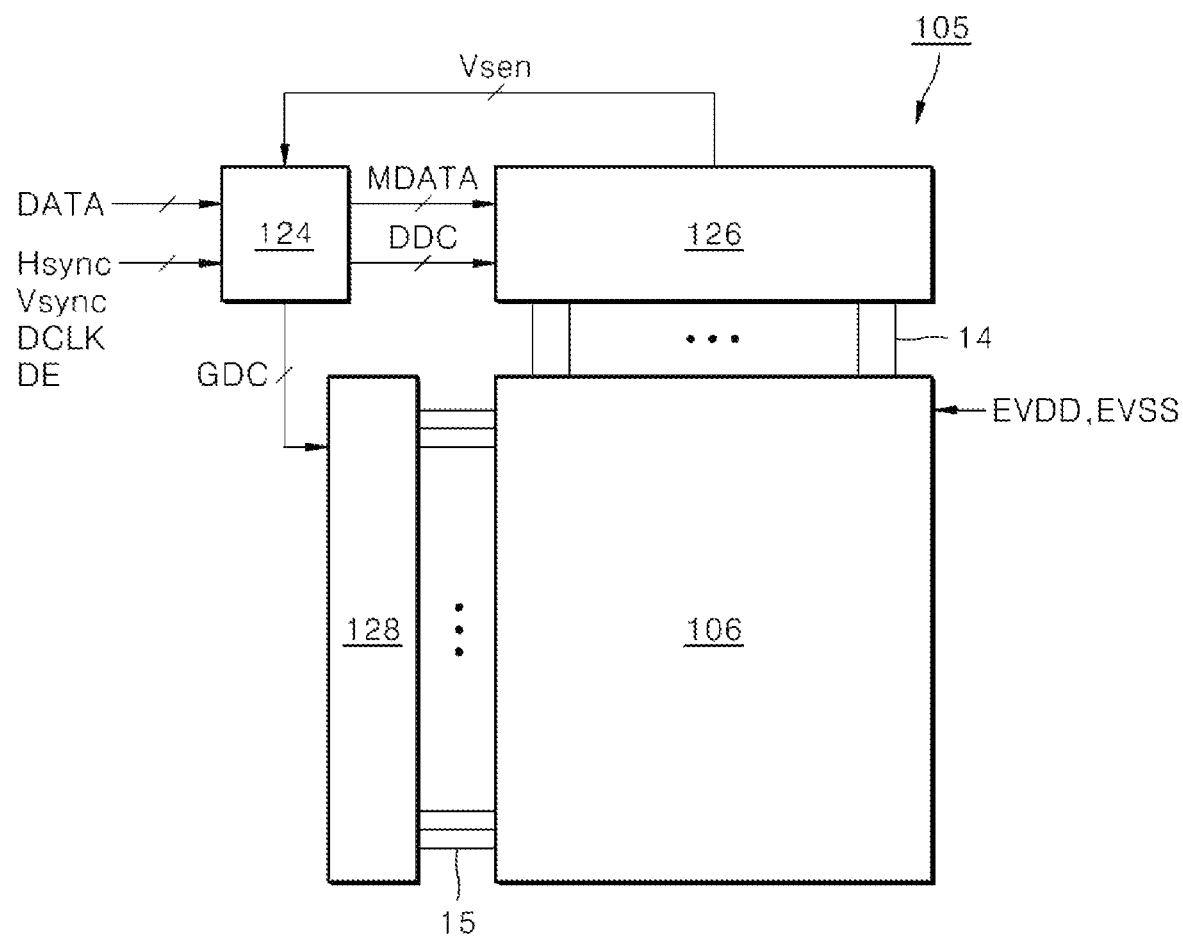
FIG. 1 is a block diagram showing a configuration of a display device according to one aspect of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be within the spirit and scope of the present disclosure as defined by the appended claims.

A shape, a size, a ratio, an angle, a number, etc. disclosed in the drawings for describing an aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular aspects only and is not intended to limit the present disclosure. As used herein, the singular may constitute "a" and "an" are intended to include the plural may constitute as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various aspects of the present disclosure may be partially or entirely combined with each other, and may be technically associated with each other or operate with each other. An aspects may be implemented independently of each other and may be implemented together in an association relationship.

In interpreting a numerical value in the disclosure, an error range may be inherent even when there is no separate explicit description thereof.

In a description of a signal flow relationship, for example, when a signal is transmitted from a node A to a node B, the signal may be transmitted from the node A via a node C to the node B, unless an indication that the signal is transmitted directly from the node A to the node B is specified.

In accordance with the present disclosure, each of a sub-pixel circuit and a gate driver circuit formed on a substrate of a display panel may be embodied as a transistor of an n-type MOSFET structure. However, the disclosure is not limited thereto. Each of a sub-pixel circuit and a gate driver circuit formed on a substrate of a display panel may be embodied as a transistor of a p-type MOSFET structure. A transistor may include a gate, a source, and a drain. In the transistor, carriers may flow from the source to the drain. In an n-type transistor, the carrier is an electron and thus a source voltage may be lower than a drain voltage so that electrons may flow from the source to the drain. In an n-type transistor, electrons flow from the source to the drain. A current direction is a direction from the drain to the source. In a p-type transistor, the carrier is a hole. Thus, the source voltage may be higher than the drain voltage so that holes may flow from the source to the drain. In the p-type transistor, the holes flow from the source to the drain. Thus, a direction of current is a direction from the source to the drain. In the transistor of the MOSFET structure, the source and the drain may not be fixed, but may be changed according to an applied voltage. Accordingly, in the present disclosure, one of the source and the drain is referred to as a first source/drain electrode, and the other of the source and the drain is referred to as a second source/drain electrode.

Hereinafter, an example of a gate driver circuit and a display device including the same according to the present disclosure will be described in detail with reference to the accompanying drawings. Across different drawings, the same elements may have the same reference numerals. Moreover, each of scales of components shown in the accompanying drawings is shown to be different from an actual scale for convenience of description. Thus, each of scales of components is not limited to a scale shown in the drawings.

Figure 2:
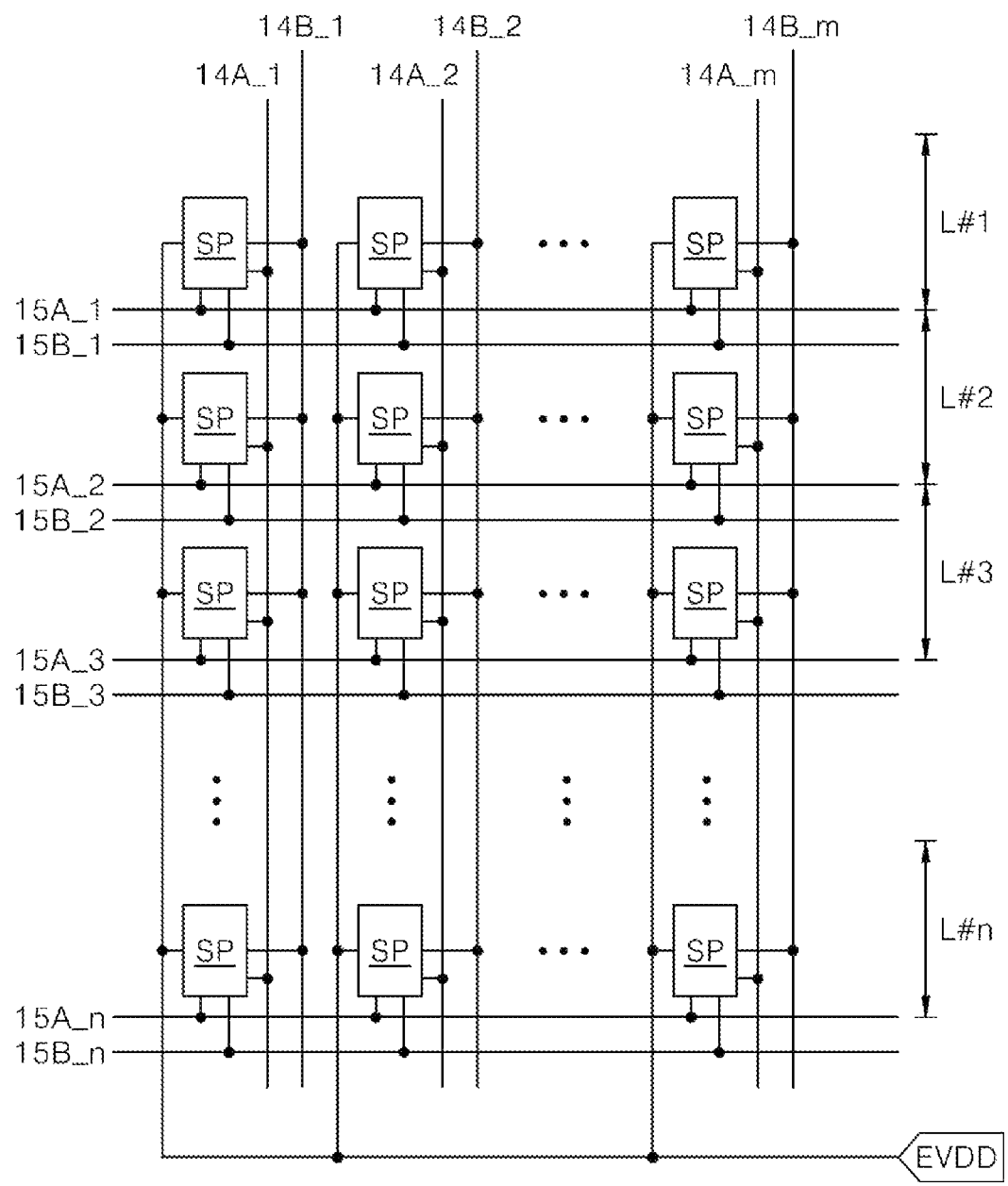
FIG. 2 shows a configuration of a sub-pixel array included in a display panel according to one aspect of the present disclosure.

FIG. 1 is a block diagram showing a configuration of a display device according to one aspect of the present disclosure. FIG. 2 shows a configuration of a sub-pixel array included in a display panel according to one aspect of the present disclosure.

Referring to FIG. 1 and FIG. 2, a display device 105 according to one aspect of the present disclosure includes a display panel 106, a data driver circuit 126, a gate driver circuit 128, and a timing controller 124.

A plurality of data lines 14 and a plurality of gate lines 16 are arranged to intersect one another on the display panel 106. Further, a plurality of sub-pixels SP are arranged in a matrix form and are respectively disposed at the intersections between the data lines 14 and the gate lines 16.

The data lines 14 includes m data voltage supply lines 14A_1 to 14A_m (m being a positive integer) and m sensed voltage readout lines 14B_1 to 14B_m. Moreover, the gate lines 15 include n (n being a positive integer) first gate lines 15A_1 to 15A_n and n second gate lines 15B_1 to 15B_n.

Each sub-pixel SP may be connected to one of the data voltage supply lines 14A_1 to 14A_m, one of the sensed voltage readout lines 14B_1 to 14B_m, one of the first gate lines 15A_1 to 15A_n, and one of the second gate lines 15B_1 to 15B_n. The sub-pixels SP may display different colors. A certain number of sub-pixel SPs may constitute one pixel P.

Each sub-pixel SP may receive a data voltage through the data voltage supply line, may receive a first gate signal through the first gate line, may receive a second gate signal through the second gate line, and may outputs a sensed voltage through the sensed voltage readout line.

That is, in the sub-pixel array shown in FIG. 2, the sub-pixels SP may operate on one horizontal line L #1 to L #n basis in response to the first gate signal supplied on a horizontal line basis from the first gate lines 15A_1 to 15A_n and the second gate signal supplied on a horizontal line basis from the second gate lines 15B_1 to 15B_n. Sub-pixels SP on the same horizontal line where a sensing operation is activated may receive a data voltage for sensing a threshold voltage from the data voltage supply lines 14A_1 to 14A_m and outputs a sensed voltage to the sensed voltage readout lines 14B_1 to 14B_m. Each of the first gate signal and the second gate signal may be a gate signal for sensing the threshold voltage or a gate signal for displaying an image, respectively. The present disclosure is not limited thereto.

Each sub-pixel SP may receive a high-potential voltage EVDD and a low-potential voltage EVSS from a power supply circuit (not shown). The sub-pixel SP may include an organic light emitting diode (OLED), a driving transistor, first and second switching transistors, and a storage capacitor. According to an aspect, a light source other than the OLED may be included in the sub-pixel SP.

Each of the transistors constituting the sub-pixel SP may be implemented as a p-type or n-type transistor. Further, a semiconductor layer of each of the transistors constituting the sub-pixel SP may include amorphous silicon or polysilicon or an oxide.

During a sensing operation for sensing a threshold voltage of the driving transistor, the data driver circuit 126 may transmit a data voltage for sensing the threshold voltage to the sub-pixels SP, based on the first gate signal for sensing the threshold voltage supplied on a horizontal line basis and may convert a sensed voltage input from the display panel 106 via the sensed voltage readout lines 14B_1 to 14B_m into a digital value and may supply the digital value to the timing controller 124. During an image display operation for image display, the data driver circuit 126 converts compensated image data MDATA input from the timing controller 124 into a data voltage for image display based on a data control signal DDC, and supplies the converted data voltage to the data voltage supply lines 14A_1 to 14A_m.

The gate driver circuit 128 generates the gate signal based on a gate control signal GDC. The gate signal may include the first gate signal for sensing the threshold voltage, the second gate signal for sensing the threshold voltage, a first gate signal for displaying an image, and a second gate signal for displaying an image.

During the sensing operation, the gate driver circuit 128 may supply the first gate signal for sensing the threshold voltage to the first gate lines 15A_1 to 15A_n on a horizontal line basis, and may supply the second gate signal for sensing the threshold voltage to the second gate lines 15B_1 to 15B_n on a horizontal line basis. During the image display operation for image display, the gate driver circuit 128 may supply the first gate signal to display the image to the first gate lines 15A_1 to 15A_n on a horizontal line basis, and may supply the second gate signal to display the image to the second gate lines 15B_1 to 15B_n on a horizontal line basis. In one aspect of the present disclosure, the gate driver circuit 128 may be disposed on the display panel 106 in a GIP (Gate-driver In Panel) scheme.

The timing controller 124 may generate and output the data control signal DDC for controlling an operation timing of the data driver circuit 126 and the gate control signal GDC for controlling an operation timing of the gate driver circuit 128, based on timing signals such as a vertical synchronization signal Vsync, a horizontal synchronization signal Hsync, a dot clock signal DCLK, and a data enable signal DE. Further, the timing controller 124 compensates image data DATA with reference to a sensed value supplied from the data driver circuit 126 to generate compensated image data MDATA for compensating for a threshold voltage deviation of the driving transistor, and supplies the compensated image data MDATA to the data driver circuit 126.

Figure 3:
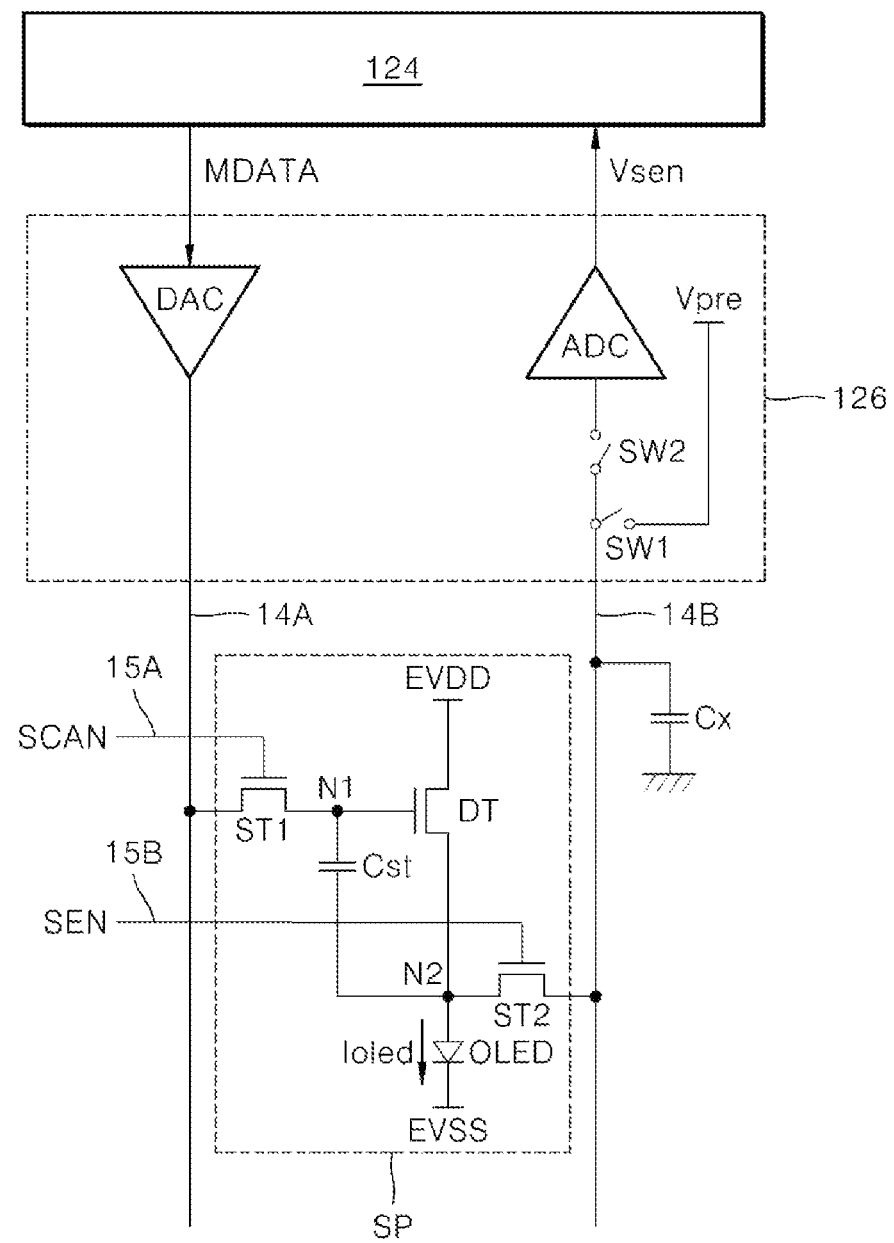
FIG. 3 shows a configuration of a sub-pixel circuit, and a connection structure between a timing controller, a data driver circuit, and a sub-pixel according to one aspect of the present disclosure.

FIG. 3 shows a configuration of a sub-pixel circuit, and a connection structure between a timing controller, a data driver circuit, and a sub-pixel according to one aspect of the present disclosure.

Referring to FIG. 3, the sub-pixel SP includes the OLED, the driving transistor DT, the storage capacitor Cst, the first switching transistor ST, and the second switching transistor ST2.

The OLED includes an anode connected to a second node N2, a cathode connected to an input side of a low-potential driving voltage EVSS, and an organic compound layer located between the anode and the cathode.

The driving transistor DT is turned on based on a gate-source voltage Vgs to control a current holed flowing through the OLED. The driving transistor DT includes a gate electrode connected to a first node N1, a drain electrode connected to an input side of a high-potential driving voltage EVDD, and a source electrode connected to the second node N2.

The storage capacitor Cst is connected to and disposed between the first node N1 and the second node N2.

The first switching transistor ST1 applies a data voltage Vdata for sensing a threshold voltage as charged in the data voltage supply line 14A to the first node N1 in response to the first gate signal SCAN for sensing the threshold voltage during the sensing operation. The first switching transistor ST1 applies a data voltage Vdata for displaying an image charged in the data voltage supply line 14A to the first node N1 in response to the first gate signal SCAN for displaying the image during an image display operation. The first switching transistor ST1 includes a gate electrode connected to the first gate line 15A, a drain electrode connected to the data voltage supply line 14A, and a source electrode connected to the first node N1.

The second switching transistor ST2 switches a current flow between the second node N2 and the sensed voltage readout line 14B in response to the second gate signal SEN for sensing the threshold voltage during the sensing operation such that a source voltage of the second node N2 which changes based on a gate voltage of the first node N1 is stored in a sensing capacitor Cx of the sensed voltage readout line 14B. The second switching transistor ST2 switches a current flow between the second node N2 and the sensed voltage readout line 14B in response to the second gate signal SEN for displaying the image during the image display operation to reset a source voltage of the driving transistor DT to an initialization voltage Vpre. The gate electrode of the second switching transistor ST2 may be connected to the second gate line 15B. The drain electrode of the second switching transistor ST2 may be connected to the second node N2. The source electrode of the second switching transistor ST2 may be connected to the sensed voltage readout line 14B.

The data driver circuit 126 is connected to the sub-pixel SP via the data voltage supply line 14A and the sensed voltage readout line 14B. The sensing capacitor Cx is connected to the sensed voltage readout line 14B to store therein a source voltage of the second node N2 as a sensed voltage Vsen. The data driver circuit 126 includes a digital-analog converter DAC, an analog-digital converter ADC, an initialization switch SW1, and a sampling switch SW2.

The DAC may generate the data voltage Vdata for sensing the threshold voltage at the same level or different levels for first and second periods of a sensing period under control of the timing controller 124 and output the generated data voltage to the data voltage supply line 14A. The DAC may convert the compensated image data MDATA to a data voltage Vdata for image display under control of the timing controller 124 for the image display period and output the converted data voltage to the data voltage supply line 14A.

The initialization switch SW1 switches current flow between an input side of the initialization voltage Vpre and the sensed voltage readout line 14B. The sampling switch SW2 switches current flow between the sensed voltage readout line 14B and the ADC. The ADC may convert an analog sensed voltage Vsen stored in the sensing capacitor Cx into a digital value and may supply the digital value to the timing controller 124.

A sensing operation process performed under control of the timing controller 124 is as follows. For the sensing operation, when the first and second gate signals SCAN and SEN for sensing the threshold voltage are applied to the sub-pixel SP while being at an on level Lon, the first switching transistor ST1 and the second switching transistor ST2 are turned on. In this connection, the initialization switch SW1 in the data driver circuit 126 is turned on.

When the first switching transistor ST1 is turned on, the data voltage Vdata for sensing the threshold voltage is supplied to the first node N1. When the initialization switch SW1 and the second switching transistor ST2 are turned on, the initialization voltage Vpre is supplied to the second node N2. In this connection, the voltage Vgs between the gate and the source of the driving transistor DT becomes larger than a threshold voltage Vth, such that a current holed flows between the drain and the source of the driving transistor DT. A source voltage VN2 of the driving transistor DT charged in the second node N2 may gradually increase due to this current holed. Thus, the source voltage VN2 of the driving transistor DT may follow a gate voltage VN1 of the driving transistor DT until the gate-source voltage Vgs of the driving transistor DT becomes the threshold voltage Vth.

The source voltage VN2 of the driving transistor DT charged in the second node N2 in the increasing manner is stored as the sensed voltage Vsen in the sensing capacitor Cx formed in the sensed voltage readout line 14B via the second switching transistor ST2. The sensed voltage Vsen may be detected when the sampling switch SW2 in the data driver circuit 12 is turned on within the sensing period for which the second gate signal SEN for sensing the threshold voltage is maintained at the on level, and then the sensed voltage Vsen as detected may be supplied to the ADC.

In one aspect of the present disclosure, the timing controller 124 may control the data driver circuit 126 and the gate driver circuit 128 so that one frame of the image data is displayed during the image display operation and then the sensing operation is performed on one horizontal line before a next frame thereof is displayed.

Figure 4:
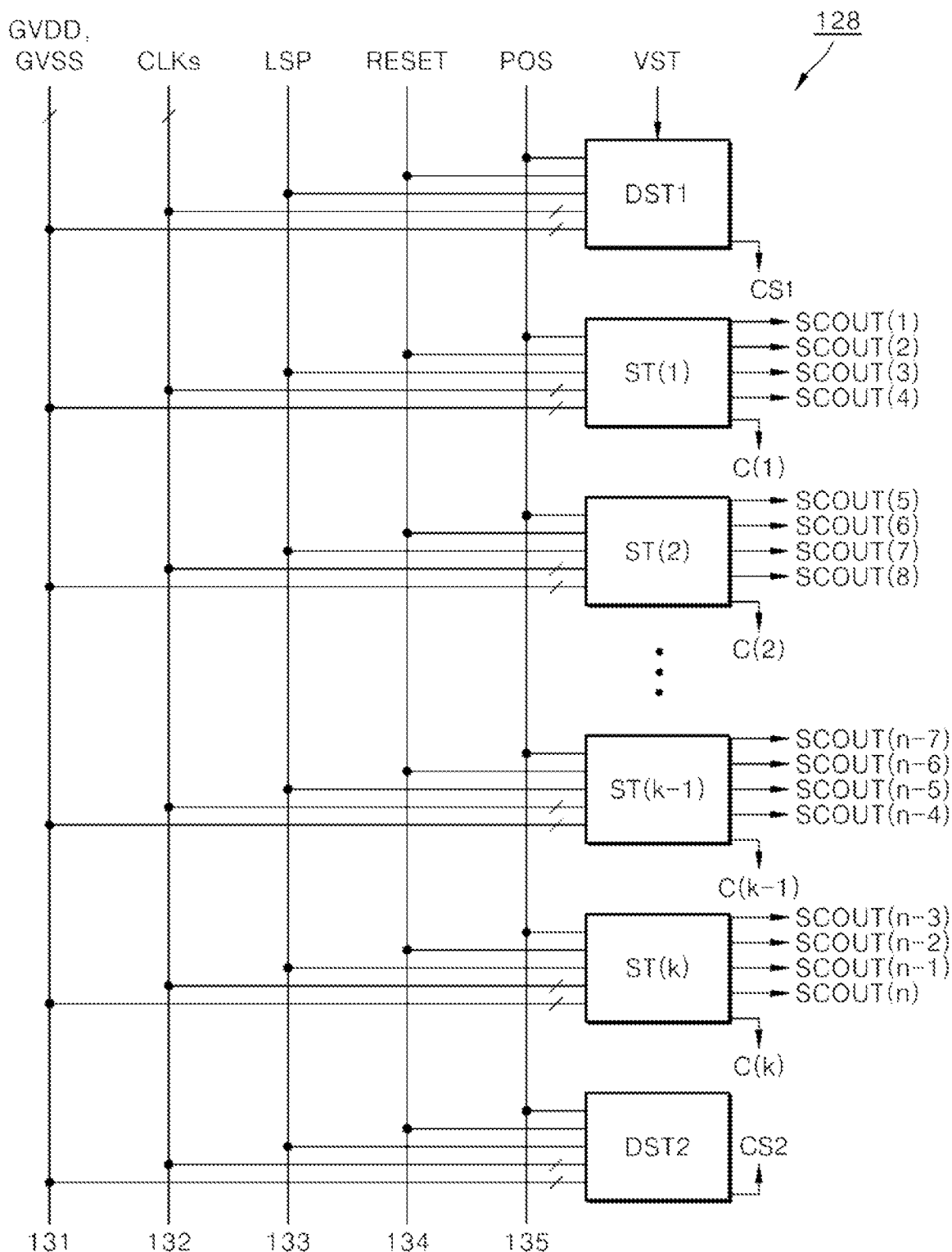
FIG. 4 shows a configuration of a plurality of stage circuits included in a gate driver circuit according to one aspect of the present disclosure.

FIG. 4 shows a configuration of a plurality of stage circuits included in the gate driver circuit according to one aspect of the present disclosure.

Referring to FIG. 4, the gate driver circuit 128 according to one aspect of the present disclosure includes first to k-th stage circuits ST(1) to ST(k) (k being a positive integer), a gate driving voltage line 131, a clock signal line 132, a line sensing preparation signal line 133, and a reset signal line 134, and a panel on signal line 135. Further, the gate driver circuit 128 may further include a front dummy stage circuit DST1 disposed in front of the first stage circuit ST(1) and a rear dummy stage circuit DST2 disposed in rear of the k-th stage circuit ST(k).

The gate driving voltage line 131 may supply a high-potential voltage GVDD and a low-potential voltage GVSS supplied from a power supply circuit (not shown) to each of the first to k-th stage circuits ST(1) to ST(k), the front dummy stage circuit DST1, and the rear dummy stage circuit DST2.

In one aspect of the present disclosure, the gate driving voltage line 131 may include a plurality of high-potential voltage lines for supplying a plurality of high-potential voltages having different voltage levels, respectively, and a plurality of low-potential voltage lines for supplying a plurality of low-potential voltages having different voltage levels, respectively.

In one example, the gate driving voltage line 131 has three high-potential voltage lines for supplying a first high-potential voltage GVDD1, a second high-potential voltage GVDD2, and a third high-potential voltage GVDD3 having different voltage levels, respectively. The gate driving voltage line 131 has three low-potential voltage lines for supplying a first low-potential voltage GVSS1, a second low-potential voltage GVSS2, and a third low-potential voltage GVSS3 having different voltage levels, respectively. However, this is only one example. The number of the lines included in the gate driving voltage line 131 may vary based on aspects.

The clock signal line 132 may supply a plurality of clock signals CLKs supplied from the timing controller 124, for example, a carry clock signal CRCLK or a scan clock signal SCCLK to each of the first to k-th stage circuits ST(1) to ST(k), the front dummy stage circuit DST1 and the rear dummy stage circuit DST2.

The line sensing preparation signal line 133 may supply a line sensing preparation signal LSP supplied from the timing controller 124 to the first to k-th stage circuits ST(1) to ST(k). Optionally, the line sensing preparation signal line 133 may be further connected to the front dummy stage circuit DST1.

The reset signal line 134 may supply a reset signal RESET supplied from the timing controller 124 to each of the first to k-th stage circuits ST(1) to ST(k), the front dummy stage circuit DST1, and the rear dummy stage circuit DST2.

The panel on signal line 135 may supply a panel on signal POS supplied from the timing controller 124 to each of the first to k-th stage circuits ST(1) to ST(k), the front dummy stage circuit DST1, and the rear dummy stage circuit DST2.

Although not shown, lines for supplying signals other than the lines 131, 132, 133, 134, and 135 as shown in FIG. 4 may be additionally connected to the first to k-th stage circuits ST(1) to ST(k), the front dummy stage circuit DST1, and the rear dummy stage circuit DST2. In one example, a line for supplying a gate start signal VST to the front dummy stage circuit DST1 may be additionally connected to the front dummy stage circuit DST1.

The front dummy stage circuit DST1 outputs a front carry signal CS1S in response to an input of the gate start signal VST supplied from the timing controller 124. The front carry signal CS1S may be supplied to one of the first to k-th stage circuits ST(1) to ST(k).

The rear dummy stage circuit DST2 outputs a rear carry signal CS2S. The rear carry signal CS2S may be supplied to one of the first to k-th stage circuits ST(1) to ST(k).

The first to k-th stage circuits ST(1) to ST(k) may be connected to each other in a cascaded manner or in a stepped manner.

In one aspect of the present disclosure, each of the first to k-th stage circuits ST(1) to ST(k) outputs j (j being a positive integer) gate signals SCOUT and one carry signal CS. That is, each stage circuit outputs first to j-th gate signals and one carry signal CS.

For example, in an aspect shown in FIG. 4, each stage circuit outputs four gate signals SCOUT and one carry signal CS. For example, the first stage circuit ST(1) outputs a first gate signal SCOUT(1), a second gate signal SCOUT(2), a third gate signal SCOUT(3), a fourth gate signal SCOUT(4) and a first carry signal CS(1). The second stage circuit ST2 outputs a fifth gate signal SCOUT(5), a sixth gate signal SCOUT(6), a seventh gate signal SCOUT(7), an eighth gate signal SCOUT(8), and a second carry signal CS(2). Therefore, in FIG. 4, j is 4.

The total number of the gate signals output from the first to k-th stage circuits ST(1) to ST(k) is equal to the number n of the gate lines 15 arranged on the display panel 106. As described above, each stage circuit outputs the j gate signals. Therefore, j×k=n is established.

For example, in the aspect shown in FIG. 4 in which j=4, the number k of the stage circuits is equal to ¼ of the number n of the gate lines 15. That is, in the aspect of FIG. 4, k=n/4.

However, the number of the gate signals output from each stage circuit is not limited thereto. That is, in another aspect of the present disclosure, each stage circuit may output one, two, or threes gate signals, or may output five or more gate signals. The number of the stage circuits may vary according to the number of the gate signals output from each stage circuit.

Hereinafter, an aspect in which each stage circuit outputs four gate signals SCOUT and one carry signal CS will be described. However, the present disclosure is not limited to this aspect.

Each of the gate signals SCOUT output from the first to k-th stage circuits ST(1) to ST(k) may act as the gate signal for sensing the threshold voltage or the gate signal for displaying the image. Further, each carry signal CS output from each of the first to k-th stage circuits ST(1) to ST(k) may be supplied to a stage circuit other than each stage circuit. In accordance with the present disclosure, a carry signal which one stage circuit receives from the front stage circuit may be referred to as the front carry signal, while a carry signal which one stage circuit receives from the rear stage circuit may be referred to as the rear carry signal.

Figure 5:
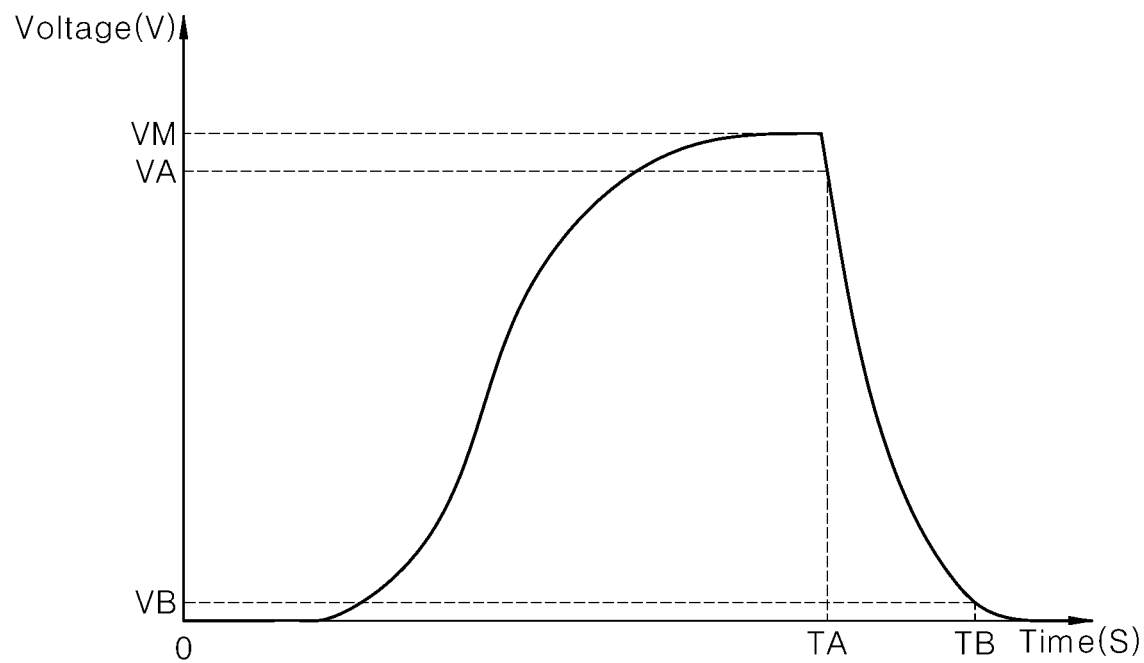
FIG. 5 shows a falling time of a gate signal.

FIG. 5 shows a falling time of the gate signal. The gate signal output from the stage circuit according to one aspect of the present disclosure may represent a voltage waveform as shown in FIG. 5. In accordance with the present disclosure, the falling time of the gate signal means a time duration it takes for a voltage value of the gate signal to change from a predetermined first reference value to a predetermined second reference value.

For example, the falling time of the gate signal shown in FIG. 5 may be defined as a time duration (TB-TA) required for a voltage value of the gate signal to change a first voltage value VA as 90% of a maximum value VM thereof to a second voltage value VB as 10% of the maximum value VM.

However, reference values (i.e., a first reference value and a second reference value) used to measure the falling time of the gate signal may vary based on aspects. For example, in another aspect of the present disclosure, the first reference value may be set to the maximum value VM of the voltage value of the gate signal, while the second reference value may be set to a minimum value of the voltage value of the gate signal, for example, 0 V of the gate signal shown in FIG. 5. According to aspects, the minimum value of the voltage value of the gate signal may be a negative value. Therefore, when the voltage value of each gate signal or a time duration of each gate signal varies, the falling time of each gate signal may vary.

Further, in accordance with the present disclosure, a rising edge timing of the gate signal means a time-point at which the gate signal rises from a low voltage level to a high voltage level. A falling edge timing of the gate signal means a time-point at which the gate signal falls from the high voltage level to the low voltage level. The above-mentioned definitions of the falling time, the rising edge timing, and the falling edge timing of the gate signal may be equally applied to other signals.

Figure 6:
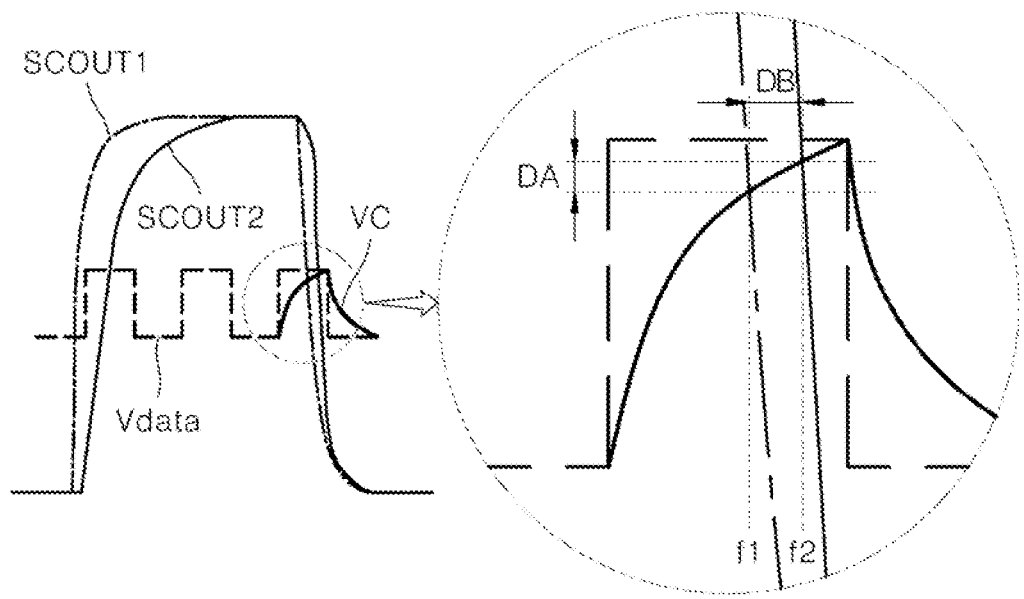
FIG. 6 shows two gate signals having different falling times, and magnitudes of voltages respectively charged to sub-pixels via the two gate signals.

FIG. 6 shows two gate signals having different falling times, and magnitudes of voltages respectively charged to sub-pixels via the two gate signals.

FIG. 6 shows two gate signals input to two different gate lines, that is, a first gate signal SCOUT1 and a second gate signal SCOUT2, respectively. As shown, a falling time of the first gate signal SCOUT1 and a falling time of the second gate signal SCOUT2 are different from each other.

Further, FIG. 6 shows a waveform of each of two voltages respectively charged to two different sub-pixels, that is, each charged voltage VC when data voltages Vdata of the same magnitude are respectively charged to the two different sub-pixels respectively belonging to the two different gate lines.

In FIG. 6, f1 represents a falling edge point of the first gate signal SCOUT1 and f2 represents a falling edge point of the second gate signal SCOUT2. Since the falling time of the first gate signal SCOUT1 and the falling time of the second gate signal SCOUT2 are different from each other, the falling edge point f1 of the first gate signal SCOUT1 and the falling edge point f2 of the second gate signal SCOUT2 are different from each other.

In one example, charging of the data voltage Vdata to each sub-pixel is terminated at the falling edge point of the gate signal. Therefore, a difference between the falling edge point f1 of the first gate signal SCOUT1 and the falling edge point f2 of the second gate signal SCOUT2 may be proportional to a difference between a charging time duration for which the data voltage Vdata is charged based on the first gate signal SCOUT1 and a charging time duration for which the data voltage Vdata is charged based on the second gate signal SCOUT2. Further, a difference between a charging time duration for which the data voltage Vdata is charged based on the first gate signal SCOUT1 and a charging time duration for which the data voltage Vdata is charged based on the second gate signal SCOUT2 may be proportional to a difference between a magnitude of a voltage charged to the sub-pixel based on the first gate signal SCOUT1 and a magnitude of a voltage charged to the sub-pixel based on the gate signal SCOUT2.

As shown in FIG. 6, due to the difference between the falling edge point f1 of the first gate signal SCOUT1 and the falling edge point f2 of the second gate signal SCOUT2, a difference DB between a charging time duration for which the data voltage Vdata is charged based on the first gate signal SCOUT1 and a charging time duration for which the data voltage Vdata is charged based on the second gate signal SCOUT2 occurs. Due to the difference DB between the charging time durations, a difference DA between the magnitudes of the charged voltages respectively charged to the sub-pixels occurs.

Eventually, when the same data voltage Vdata is charged to two sub-pixels respectively connected to different gate lines, and when an output difference between the gate signals respectively supplied to the two gate lines occurs, the difference DA between the magnitudes or amounts of the charged voltages respectively charged to two sub-pixels may occur. Due to the difference DA between the magnitudes or amounts of the charged voltages respectively charged to two sub-pixels, a difference in terms of color or brightness between an image of one line and an image of another line may be recognized as a line defect to a viewer when the image is displayed from the display device.

Therefore, the smaller the output difference between the gate signals respectively supplied to the gate lines, the better the image display quality of the display device. In this connection, the output difference between the gate signals may vary based on the voltage magnitude, the time duration, or the falling time of each of the gate signals.

Hereinafter, aspects of a stage circuit capable of reducing the output difference between the gate signals respectively supplied to the gate lines are described.

Figure 7:
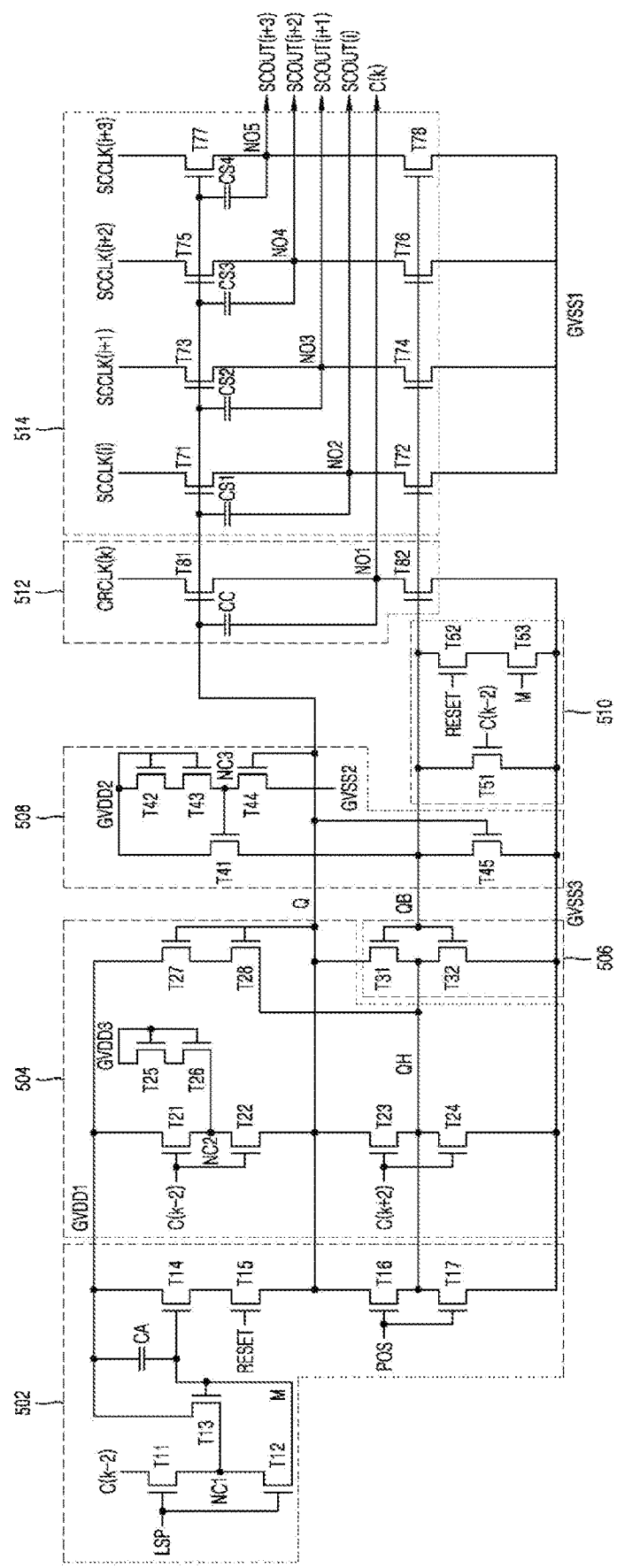
FIG. 7 is a circuit diagram of a stage circuit according to one aspect of the present disclosure.

FIG. 7 is a circuit diagram of a stage circuit according to one aspect of the present disclosure. The stage circuit shown in FIG. 7 may be one stage circuit among the first to k-th stage circuits ST(1) to ST(k) shown in FIG. 4.

Referring to FIG. 7, the stage circuit according to one aspect of the present disclosure includes an M node, a Q node, and a QB node. Further, the stage circuit according to one aspect of the present disclosure includes a line selector 502, a Q node controller 504, a Q node and QH node stabilizer 506, an inverter 508, a QB node stabilizer 510, a carry signal output module 512, and a gate signal output module 514.

The line selector 502 charges the M node based on the front carry signal CS1(k−2) in response to an input of the line sensing preparation signal LSP. Further, the line selector 502 charges the Q node to a first high-potential voltage GVDD1 level based on a charged voltage of the M node in response to an input of the reset signal RESET. Further, the line selector 502 discharges or resets the Q node to a third low-potential voltage GVSS3 level in response to an input of the panel on signal POS.

The line selector 502 includes first to seventh transistors T11 to T17 and a pre-charging capacitor CA.

The first transistor T11 and the second transistor T12 are connected to and disposed between a first high-potential voltage line for delivering the first high-potential voltage GVDD1 and the M node. Further, the first transistor T11 and the second transistor T12 are connected in series with each other.

The first transistor T11 outputs a front carry signal CS1(k−2) to a first connection node NC1 in response to an input of the line sensing preparation signal LSP. The second transistor T12 electrically connects the first connection node NC1 to the M node in response to an input of the line sensing preparation signal LSP. For example, when the line sensing preparation signal LSP of a high voltage level voltage is input to the first transistor T11 and the second transistor T12, the first transistor T11 and the second transistor T12 are simultaneously turned on to charge the M node to the first high-potential voltage GVDD1 level.

A third transistor T13 may be turned on when a voltage level of the M node is at a high voltage level, and thus may supply the first high-potential voltage GVDD1 to the first connection node NC1. When the first high-potential voltage GVDD1 is supplied to the first connection node NC1, a difference between a gate voltage of the first transistor T11 and a voltage of the first connection node NC1 increases. Therefore, when the line sensing preparation signal LSP of a low voltage level voltage is input to a gate of the first transistor T11 such that the first transistor T11 is turned off, the first transistor T11 may be maintained in a completely turned off state due to the difference between the gate voltage of the first transistor T11 and the voltage of the first connection node NC1. Accordingly, current leakage of the first transistor T11 and thus, voltage drop of the M node may be prevented, so that the voltage of the M node may be stably maintained.

The pre-charging capacitor CA is connected to and disposed between the first high-potential voltage line for delivering the first high-potential voltage GVDD1 and the M node, and stores therein a voltage corresponding to a difference between the first high-potential voltage GVDD1 and a voltage charged to the M node. When the first transistor T11, the second transistor T12, and the third transistor T13 are turned on, the pre-charging capacitor CA stores therein a high voltage level voltage of the front carry signal CS1 (k−2). When the first transistor T11, the second transistor T12, and the third transistor T13 are turned off, the pre-charging capacitor CA maintains the voltage of the M node using the voltage stored therein for a certain period of time.

A fourth transistor T14 and a fifth transistor T15 are connected to and disposed between the Q node and the first high-potential voltage line for delivering the first high-potential voltage GVDD1. The fourth transistor T14 and the fifth transistor T15 are connected in series with each other.

The fourth transistor T14 and the fifth transistor T15 charge the Q node to the first high-potential voltage GVDD1 in response to the voltage of the M node and an input of the reset signal RESET. The fourth transistor T14 may be turned on when the voltage of the M node is at a high voltage level, and thus may transmit the first high-potential voltage GVDD1 to a shared node between the fourth transistor T14 and the fifth transistor T15. The fifth transistor T15 may be turned on based on a high voltage level reset signal RESET to supply the voltage of the shared node to the Q node. Therefore, when the fourth transistor T14 and the fifth transistor T15 are simultaneously turned on, the Q node is charged with the first high-potential voltage GVDD1.

A sixth transistor T16 and a seventh transistor T17 are connected to and disposed between the Q node and a third low-potential voltage line that may transmit the third low-potential voltage GVSS3. The sixth transistor T16 and the seventh transistor T17 are connected in series to each other.

The sixth transistor T16 and the seventh transistor T17 discharge the Q node to the third low-potential voltage GVSS3 in response to an input of the panel on signal POS. The Q node being discharged to the third low-potential voltage GVSS3 may also be referred to as the Q node being reset. The seventh transistor T17 may be turned on based on an input of a high voltage level panel on signal POS to supply the third low-potential voltage GVSS3 to the QH node. The sixth transistor T16 is turned on according to an input of the high voltage level panel-on signal POS to electrically connect the Q node and the QH node to each other. Therefore, when the sixth transistor T16 and the seventh transistor T17 are simultaneously turned on, the Q node is discharged or reset to the third low-potential voltage GVSS3.

The Q node controller 504 charges the Q node to the first high-potential voltage GVDD1 level, in response to an input of the front carry signal CS1($k$–2), and discharges the Q node to the third low-potential voltage GVSS3 level, in response to an input of the rear carry signal CS2($k$+2).

The Q node controller 504 includes first to eighth transistors T21 to T28.

The first transistor T21 and the second transistor T22 are connected to and disposed between the Q node and the first high-potential voltage line for delivering the first high-potential voltage GVDD1. The first transistor T21 and the second transistor T22 are connected in series with each other.

The first transistor T21 and the second transistor T22 charge the Q node to the first high-potential voltage GVDD1 level in response to an input of the front carry signal CS1($k$–2). The first transistor T21 may be turned on according to an input of the front carry signal CS1($k$–2) and thus may supply the first high-potential voltage GVDD1 to the second connection node NC2. The second transistor T22 may be turned on according to an input of the front carry signal CS1($k$–2) and may electrically connect the second connection node NC2 and the Q node to each other. Therefore, when the first transistor T21 and the second transistor T22 are simultaneously turned on, the first high-potential voltage GVDD1 is supplied to the Q node.

A fifth transistor T25 and a sixth transistor T26 are connected to the third high-potential voltage line for delivering the third high-potential voltage GVDD3. The fifth transistor T25 and the sixth transistor T26 supply the third high-potential voltage GVDD3 to a second connection node NC2 in response to the third high-potential voltage GVDD3.

The fifth transistor T25 and the sixth transistor T26 are turned on at the same time based on the third high-potential voltage GVDD3, such that the third high-potential voltage GVDD3 is constantly supplied to the second connection node NC2, thereby increasing a difference between the gate voltage of the first transistor T21 and a voltage of the second connection node NC2. Therefore, when a low voltage level front carry signal CS1($k$–2) is input to the gate of the first transistor T21 and thus, the first transistor T21 is turned off, the first transistor T21 may be maintained in a completely turned-off state due to the difference between the gate voltage of the first transistor T21 and the voltage of the second connection node NC2. Accordingly, the current leakage of the first transistor T21 and thus, the voltage drop of the Q node may be prevented, so that the voltage of the Q node may be stably maintained.

In one example, when a threshold voltage of the first transistor T21 is negative (−), the gate-source voltage Vgs of the first transistor T21 is maintained to be negative (−) due to the third high-potential voltage GVDD3 supplied to the drain electrode. Therefore, when the low voltage level front carry signal CS1($k$–2) is input to the gate of the first transistor T21 and thus the first transistor T21 is turned off, the first transistor T21 may be maintained in a completely turned off state to prevent the leakage current therefrom.

In one aspect of the present disclosure, the third high-potential voltage GVDD3 is set to a lower voltage level than that of the first high-potential voltage GVDD1.

A third transistor T23 and a fourth transistor T24 are connected to and disposed between the Q node and the third low-potential voltage line for delivering the third low-potential voltage GVSS3. The third transistor T23 and the fourth transistor T24 are connected in series with each other.

The third transistor T23 and the fourth transistor T24 discharge the Q node and the QH node to the third low-potential voltage GVSS3 level in response to an input of the rear carry signal CS2($k$+2). The fourth transistor T24 is turned on according to an input of the rear carry signal CS2($k$+2) to discharge the QH node to the third low-potential voltage GVSS3 level. The third transistor T23 is turned on according to an input of the rear carry signal CS2($k$+2) to electrically connect the Q node and the QH node to each other. Therefore, when the third transistor T23 and the fourth transistor T24 are simultaneously turned on, each of the Q node and the QH node is discharged or reset to the third low-potential voltage GVSS3 level.

A seventh transistor T27 and an eighth transistor T28 are connected to and disposed between the first high-potential voltage line for delivering the first high-potential voltage GVDD1 and the Q node, and are connected to and disposed between the first high-potential voltage line for delivering the first high-potential voltage GVDD1 and the QH node. The seventh transistor T27 and the eighth transistor T28 are connected in series with each other.

The seventh transistor T27 and the eighth transistor T28 supply the first high-potential voltage GVDD1 to the QH node in response to the voltage of the Q node. The seventh transistor T27 may be turned on when the voltage of the Q node is at a high voltage level and thus may supply the first high-potential voltage GVDD1 to a shared node between the seventh transistor T27 and the eighth transistor T28. The eighth transistor T28 may be turned on when the voltage of the Q node is at a high voltage level and thus may electrically connect the shared node and the QH node to each other. Therefore, the seventh transistor T27 and the eighth transistor T28 are simultaneously turned on when the voltage of the Q node is at a high voltage level, such that the first high-potential voltage GVDD1 is supplied to the QH node.

When the first high-potential voltage GVDD1 is supplied to the QH node, a difference between the gate voltage of the third transistor T23 and the voltage of the QH node increases. Therefore, when the low voltage level rear carry signal CS2($k$+2) is input to the gate of the third transistor T23 and thus the third transistor T23 is turned off, the third transistor T23 may be maintained in a completely turned off state due to the difference between the gate voltage of the third transistor T23 and the voltage of the QH node. Accordingly, current leakage of the third transistor T23 and thus, the voltage drop of the Q node may be prevented, so that the voltage of the Q node may be stably maintained.

The Q node and QH node stabilizer 506 discharges the Q node and the QH node to the third low-potential voltage GVSS3 level in response to the voltage of the QB node.

The Q node and QH node stabilizer 506 includes a first transistor T31 and a second transistor T32. The first transistor T31 and the second transistor T32 are connected to and disposed between the Q node and the third low-potential voltage line for delivering the third low-potential voltage GVSS3. The first transistor T31 and the second transistor T32 are connected in series with each other.

The first transistor T31 and the second transistor T32 discharge the Q node and the QH node to the third low-potential voltage GVSS3 level in response to the voltage of the QB node. The second transistor T32 may be turned on when the voltage of the QB node is at a high voltage level and thus may supply the third low-potential voltage GVSS3 to a shared node between the first transistor T31 and the second transistor T32. The first transistor T31 may be turned on when the voltage of the QB node is at a high voltage level and thus may electrically connect the Q node and the QH node to each other. Therefore, when the first transistor T31 and the second transistor T32 are turned on simultaneously in response to the voltage of the QB node, each of the Q node and the QH node may be discharged or reset to the third low-potential voltage GVSS3 level.

The inverter 508 changes a voltage level of the QB node according to a voltage level of the Q node.

The inverter 508 includes first to fifth transistors T41 to T45.

A second transistor T42 and a third transistor T43 are connected to and disposed between a second high-potential voltage line for delivering the second high-potential voltage GVDD2 and a third connection node NC3. The second transistor T42 and the third transistor T43 are connected in series with each other.

The second transistor T42 and the third transistor T43 supply the second high-potential voltage GVDD2 to the third connection node NC3 in response to the second high-potential voltage GVDD2. The second transistor T42 is turned on based on the second high-potential voltage GVDD2 to supply the second high-potential voltage GVDD2 to a shared node between the second transistor T42 and the third transistor T43. The third transistor T43 is turned on based on the second high-potential voltage GVDD2 to electrically connect the shared node between the second transistor T42 and the third transistor T43 to the third connection node NC3. Therefore, when the second transistor T42 and the third transistor T43 are simultaneously turned on based on the second high-potential voltage GVDD2, the third connection node NC3 is charged to the second high-potential voltage GVDD2 level.

The fourth transistor T44 is connected to and disposed between the third connection node NC3 and the second low-potential voltage line for delivering the second low-potential voltage GVSS2.

The fourth transistor T44 may supply the second low-potential voltage GVSS2 to the third connection node NC3 in response to a voltage of the Q node. The fourth transistor T44 may be turned on when the voltage of the Q node is at a high voltage level and thus may discharge or reset the third connection node NC3 to the second low-potential voltage GVSS2.

The first transistor T41 is connected to and disposed between the second high-potential voltage line for delivering the second high-potential voltage GVDD2 and the QB node.

The first transistor T41 may supply the second high-potential voltage GVDD2 to the QB node in response to a voltage of the third connection node NC3.

The first transistor T41 may be turned on when the voltage of the third connection node NC3 is at a high voltage level and thus may charge the QB node to the second high-potential voltage GVDD2 level.

The fifth transistor T45 is connected to and disposed between the QB node and the third low-potential voltage line for delivering the third low-potential voltage GVSS3.

The fifth transistor T45 may supply the third low-potential voltage GVSS3 to the QB node in response to a voltage of the Q node. The fifth transistor T45 may be turned on when the voltage of the Q node is at a high voltage level and thus may discharge or reset the QB node to the third low-potential voltage GVSS3 level.

The QB node stabilizer 510 discharges the QB node to the third low-potential voltage GVSS3 level in response to an input of the rear carry signal CS2($k$–2), to an input of the reset signal, and to a charged voltage of the M node.

The QB node stabilizer 510 includes first to third transistor T51 to T53.

The first transistor T51 is connected to and disposed between the QB node and the second low-potential voltage line for delivering the third low-potential voltage GVSS3.

The first transistor T51 may supply a third low-potential voltage GVSS3 to the QB node in response to an input of the rear carry signal CS2($k$–2). The fifth transistor T45 may be turned on when the voltage of the Q node is at a high voltage level and thus may discharge or reset the QB node to the third low-potential voltage GVSS3 level.

The second transistor T52 and the third transistor T53 are connected to and disposed between the QB node and the third low-potential voltage line for delivering the third low-potential voltage GVSS3. The second transistor T52 and the third transistor T53 are connected in series with each other.

The second transistor T52 and the third transistor T53 discharge the QB node to the third low-potential voltage GVSS3 level in response to an input of the reset signal and a charged voltage of the M node. The third transistor T53 may be turned on when the voltage of the M node is at a high voltage level and thus may supply the third low-potential voltage GVSS3 to a shared node between the second transistor T52 and the third transistor T53. The second transistor T52 may be turned on based on an input of the reset signal RESET, such that the shared node between the second transistor T52 and the third transistor T53 is electrically connected to the QB node. Therefore, when the reset signal RESET is input to the second transistor T52 and the third transistor T53 while the voltage of the M node is at a high voltage level, the second transistor T52 and the third transistor T53 are turned on at the same time to discharge or reset the QB node to the third low-potential voltage GVSS2 level.

The carry signal output module 512 outputs the carry signal C(k) based on a voltage level of the carry clock signal CRCLK(k) or the third low-potential voltage GVSS3 level, according to a voltage level of the Q node or a voltage level of the QB node.

The carry signal output module 512 includes a first transistor T81, a second transistor T82, and a boosting capacitor CC.

The first transistor T81 is connected to and disposed between a clock signal line for delivering the carry clock signal CRCLK(k) and a first output node NO1. The boosting capacitor CC is connected to and disposed between a gate and a source of the first transistor T81.

The first transistor T81 outputs a high voltage level voltage carry signal C(k) through the first output node NO1, based on the carry clock signal CRCLK(k), in response to a voltage of the Q node. The first transistor T81 may be turned on when the voltage of the Q node is at a high voltage level and thus may supply the carry clock signal CRCLK(k) of a high voltage level voltage to the first output node NO1. Accordingly, the high voltage level voltage carry signal C(k) is output.

When the carry signal C(k) is output, the boosting capacitor CC bootstraps a voltage of the Q node to a boosting voltage level higher than the first high-potential voltage GVDD1 level while being in synchronization with the carry clock signal CRCLK(k) of the high voltage level. When the voltage of the Q node is bootstrapped, the high voltage level carry clock signal CRCLK(k) may be output as the carry signal C(k) quickly and without distortion.

The second transistor T82 is connected to and disposed between the first output node NO1 and the third low-potential voltage line for delivering the third low-potential voltage GVSS3.

The second transistor T82 outputs a low voltage level voltage carry signal C(k) through the first output node NO1, based on the third low-potential voltage GVSS3, in response to a voltage of the QB node. The second transistor T82 may be turned on when the voltage of the QB node is at a high voltage level and thus may supply the third low-potential voltage GVSS3 to the first output node NO1. Accordingly, the low voltage level voltage carry signal C(k) is output.

The gate signal output module 514 may output a plurality of the gate signals SCOUT(i), SCOUT(i+1), SCOUT(i+2), and SCOUT(i+3), based on voltage levels of a plurality of scan clock signals SCCLK(i), SCCLK(i+1), SCCLK(i+2), and SCCLK(i+3), or the first low-potential voltage GVSS1 level, according to a voltage level of the Q node or a voltage level of the QB node. In this connection, i is a positive integer.

The gate signal output module 514 includes first to eighth transistors T71 to T78, and boosting capacitors CS1, CS2, CS3, and CS4.

A first transistor T71, a third transistor T73, a fifth transistor T75, and a seventh transistor T77 are respectively connected to and disposed between the QB node and clock signal lines for respectively delivering scan clock signals SCCLK(i), SCCLK(i+1), SCCLK(i+2) and SCCLK(i+3). Each of the boosting capacitors CS1, CS2, CS3, and CS4 is connected to and disposed between a gate and a source of each of the first transistor T71, the third transistor T73, the fifth transistor T75, and the seventh transistor T77.

Each of the first transistor T71, the third transistor T73, the fifth transistor T75, and the seventh transistor T77 outputs each of high voltage level voltage gate signals SCOUT(i), SCOUT(i+1), SCOUT(i+2), and SCOUT(i+3) via each of a second output node NO2, a third output node NO3, a fourth output node NO4, and a fifth output node NO5, based on each of the scan clock signals SCCLK(i), SCCLK(i+1), SCCLK(i+2), and SCCLK(i+3), and in response to a voltage of the Q node. Each of the first transistor T71, the third transistor T73, the fifth transistor T75, and the seventh transistor T77 is turned on when the voltage of the Q node is at a high voltage level and thus may supply each of the high voltage level voltage scan clock signals SCCLK(i), SCCLK(i+1), SCCLK(i+2), and SCCLK (i+3) to each of the second output node NO2, the third output node NO3, the fourth output node NO4, and the fifth output node NO5. Accordingly, the high voltage level voltage gate signals SCOUT(i), SCOUT(i+1), SCOUT(i+2), and SCOUT(i+3) are respectively output.

When the gate signals SCOUT(i), SCOUT(i+1), SCOUT(i+2), SCOUT(i+3) are respectively output, the boosting capacitors CS1, CS2, CS3, and CS4 bootstrap or increase the voltage of the Q node to a boosting voltage level higher than the first high-potential voltage GVDD1 level, while being respectively synchronized with the high voltage level voltage scan clock signals SCCLK(i), SCCLK(i+1), SCCLK(i+2), and SCCLK(i+3). When the voltage of the Q node is bootstrapped, the high voltage level scan clock signals SCCLK(i), SCCLK(i+1), SCCLK(i+2), and SCCLK(i+3) may be respectively output as the gate signals SCOUT(i), SCOUT(i+1), SCOUT(i+2), and SCOUT(i+3) quickly and without distortion.

A second transistor T72, a fourth transistor T74, a sixth transistor T76, and an eighth transistor T78 respectively output low voltage level voltage gate signals SCOUT(i), SCOUT(i+1), SCOUT(i+2), and SCOUT(i+3) respectively via the second output node NO2, the third output node NO3, the fourth output node NO4, and the fifth output node NO5, based on the first low-potential voltage GVSS1 and in response to a voltage of the QB node. The second transistor T72, the fourth transistor T74, the sixth transistor T76, and the eighth transistor T78 may be respectively turned on when the voltage of the QB node is at a high voltage level and thus may supply the first low-potential voltage GVSS1 to the second output node NO2, the third output node NO3, the fourth output node NO4, and the fifth output node NO5, respectively. Accordingly, the low voltage level voltage gate signals SCOUT(i), SCOUT(i+1), SCOUT(i+2), and SCOUT(i+3) are respectively output.

In the aspect shown in FIG. 7, each stage circuit may receive the three high-potential voltages GVDD1, GVDD2, and GVDD3 set to different levels, and the three low-potential voltages GVSS1, GVSS2, and GVSS3 set to different levels. For example, the first high-potential voltage GVDD1 may be set to 20 V, the second high-potential voltage GVDD2 may be set to 16 V, and the third high-potential voltage GVDD3 may be set to 14 V. The first low-potential voltage GVSS1 may be set to −6 V, the second low-potential voltage GVSS2 may be set to −10 V, and the third low-potential voltage GVSS3 may be set to −12 V. These numerical values are just one example. The levels of the high-potential voltages and the low-potential voltage may vary based on aspects.

Figure 8:
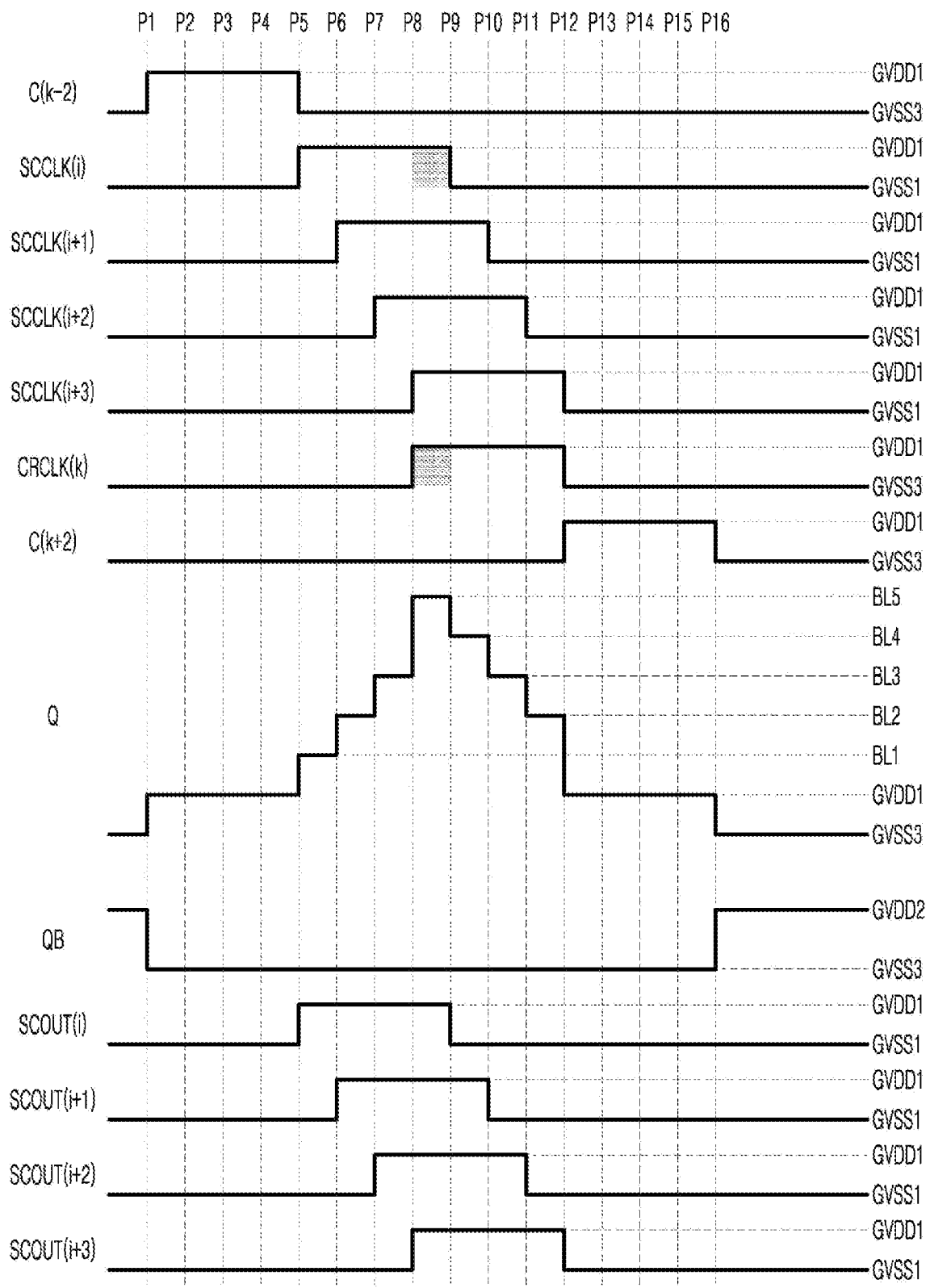
FIG. 8 shows a waveforms of each of an input signal and an output signal when the stage circuit of FIG. 7 outputs a gate signal for image display according to one aspect of the present disclosure.

FIG. 8 shows a waveform of each of an input signal and an output signal when the stage circuit of FIG. 7 outputs a gate signal for image display, according to one aspect of the present disclosure.

When a high voltage level front carry signal CS1(k−2) is input for a period P1 to P5, the first transistor T21 and the second transistor T22 of the Q node controller 504 are turned on. Accordingly, the Q node has been charged to the first high-potential voltage GVDD1 level. Further, the first transistor T51 of the QB node stabilizer 510 is turned on based on a high voltage level front carry signal CS1(k−2), and thus the QB node has been discharged to the third low-potential voltage GVSS3 level.

When a high voltage level scan clock signal SCCLK(i) is input for a period P5 to P6, the boosting capacitor CS1 may bootstrap a voltage of the Q node to a first boosting voltage BL1 level higher than that of the first high-potential voltage GVDD1. Accordingly, the gate signal SCOUT(i) is output from second output node NO2 for a period P5 to P6.

When a high voltage level scan clock signal SCCLK(i+1) together with a high voltage level scan clock signal SCCLK(i) are input for a period P6 to P7, the boosting capacitors CS1 and CS2 bootstrap a voltage of the Q node to a second boosting voltage BL2 level which is higher than that of the first boosting voltage BL1. Accordingly, the gate signal SCOUT(i+1) is output from the third output node NO3 for a period P6 to P7.

When a high voltage level scan clock signal SCCLK(i+2) together with a high voltage level scan clock signal SCCLK(i) and a high voltage level scan clock signal SCCLK(i+1) are input for a period P7 to P8, the boosting capacitors C1, CS2, and CS3 bootstrap the voltage of the Q node to a third boosting voltage BL3 level which is higher than that of the second boosting voltage BL2. Accordingly, the gate signal SCOUT(i+2) is output from the fourth output node NO4 for a period P7 to P8.

A high voltage level scan clock signal SCCLK(i+3) together with a high voltage level scan clock signal SCCLK(i), a high voltage level scan clock signal SCCLK(i+1), and a high voltage level scan clock signal SCCLK(i+2) are input for a period P8 to P9.

Further, for the period P8 to P9, a high voltage level carry clock signal CRCLK(k) is input. That is, in the aspect of FIG. 8, a rising edge timing P8 of the carry clock signal CRCLK(k) is earlier than a falling edge timing P9 of the scan clock signal SCCLK(i). Further, in the aspect of FIG. 8, a falling edge timing P12 of the carry clock signal CRCLK(k) is the same as a falling edge timing P12 of the scan clock signal SCCLK(i+3).

As a result, as indicated in a shaded manner in FIG. 8, for the period P8 to P9, each of the scan clock signal SCCLK(i) and the carry clock signal CRCLK(k) is maintained at a high voltage level.

In other words, in one aspect of the present disclosure, a partial period P8 to P9 of a high voltage level period of the carry clock signal CRCLK(k) overlaps with a partial period P8 to P9 of a high voltage level period of the first scan clock signal (e.g., the scan clock signal SCCLK(i)).

Accordingly, for the period P8 to P9, the boosting capacitors CC, CS1, CS2, CS3, and CS4 bootstrap the voltage of the Q node to a fifth boosting voltage BL5 level higher than each of the third boosting voltage BL3 level and the fourth boosting voltage level BL4. Accordingly, the gate signal SCOUT(i+3) is output from fifth output node NO5 for the period P8 to P9.

For the period P9 to P10, a high voltage level scan clock signal SCCLK(i+1), a high voltage level scan clock signal SCCLK(i+2), a high voltage level scan clock signal SCCLK(i+3), and a high voltage level carry clock signal CRCLK(k) are input. Therefore, the boosting capacitor CC, CS2, CS3, and CS4 bootstrap the voltage of the Q node to the fourth boosting voltage BL4 level lower than the fifth boosting voltage BL5 level. Further, for the period P9 to P10, a voltage level of each of the scan clock signal SCCLK(i) and the gate signal SCOUT(i) is lowered to a low voltage level.

For a period P10 to P11, a high voltage level scan clock signal SCCLK(i+2), a high voltage level scan clock signal SCCLK(i+3) and a high voltage level carry clock signal CRCLK(k) are input. Therefore, the boosting capacitors CC, CS3, and CS4 bootstrap the voltage of the Q node to the third boosting voltage BL3 level lower than the fourth boosting voltage BL4 level. Further, for the period P10 to P11, a voltage level of each of the scan clock signal SCCLK(i+1) and the gate signal SCOUT(i+1) is lowered to a low voltage level.

For a period P11 to P12, a high voltage level scan clock signal SCCLK(i+3) and a high voltage level carry clock signal CRCLK(k) are input. Therefore, the boosting capacitors CC and CS4 bootstrap the voltage of the Q node to the second boosting voltage BL2 level lower than the third boosting voltage BL3 level. Further, for the period P11 to P12, a voltage level of each of the scan clock signal SCCLK(i+2) and the gate signal SCOUT(i+2) is lowered to a low voltage level.

For a period P12 to 13, a voltage level of each of the scan clock signal and the carry clock signal is lowered to a low voltage level. Further, for the period P12 to 13, a high voltage level rear carry signal CS2(k+2) is input. Accordingly, for the period P12 to 13, a voltage level of the Q node is lowered to the first high-potential voltage GVDD1 level.

Further, for the period P12 to 13, a voltage level of each of the scan clock signal SCCLK(i+3) and the gate signal SCOUT(i+3) is lowered to a low voltage level.

Although not shown, when a high voltage level carry clock signal CRCLK(k) is input for a period P8 to P11, the carry signal C(k) is output from the first output node NO1 via the first transistor T81 which has been turned on based on the voltage charged to the Q node.

When a high voltage level rear carry signal CS2(k+2) is input for a period P12 to P16, the third transistor T23 and the fourth transistor T24 of the Q node controller 504 are turned on. Accordingly, the Q node is discharged to the third low-potential voltage GVSS3 level at a time-point P16. When the Q node has been discharged to the third low-potential voltage GVSS3 level, the fourth transistor T44 included in the inverter 508 may be turned off. The second high-potential voltage GVDD2 may be input to a gate of the first transistor T41, such that the first transistor T41 may be turned on. When the first transistor T41 is turned on, the QB node is charged to the second high-potential voltage GVDD2 level.

Figure 9:
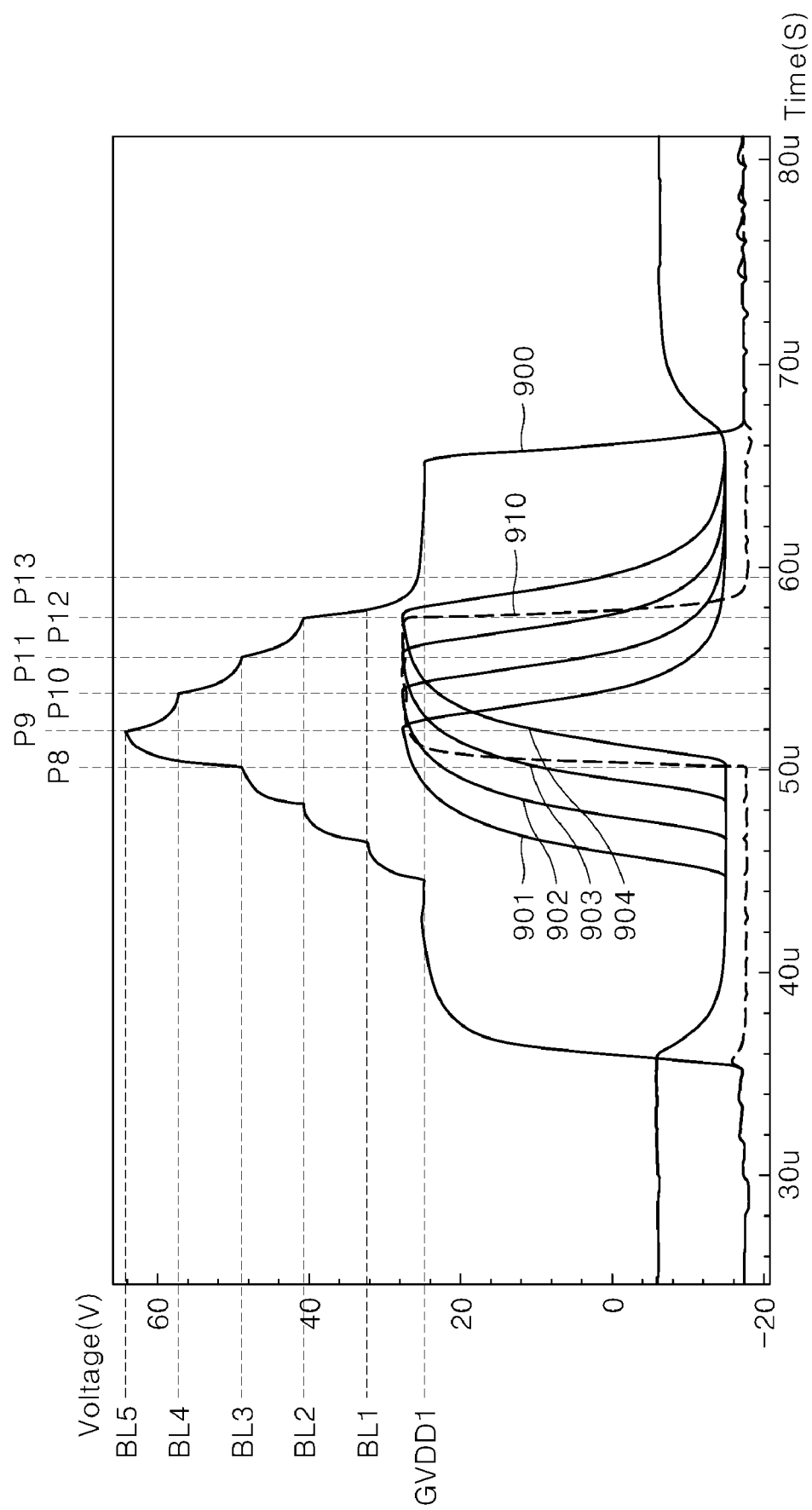
FIG. 9 shows a waveform of a voltage of a Q node, a voltage waveform of a carry clock signal, and voltage waveforms of gate signals when the gate signals for image display are output from the stage circuit of FIG. 7 and according to one aspect of FIG. 8.

FIG. 9 shows a waveform of a voltage of a Q node, a voltage waveform of a carry clock signal, and voltage waveforms of gate signals when the gate signals for image display are output from the stage circuit of FIG. 7 and according to one aspect of FIG. 8.

FIG. 9 shows a voltage waveform 900 of the Q node, a voltage waveform 901 of the gate signal SCOUT(i), a voltage waveform 902 of the gate signal SCOUT(i+1), a voltage waveform 903 of the gate signal SCOUT(i+2), a voltage waveform 904 of the gate signal SCOUT(i+3), and a voltage waveform 910 of the carry clock signal CRCLK(k) among waveforms of the signals shown in FIG. 8.

As described above, for the period P8 to P9 for which all of the gate signal SCOUT(i), the gate signal SCOUT(i+1), the gate signal SCOUT(i+2), and the gate signal SCOUT(i+3) are output, the voltage waveform 910 of the carry clock signal CRCLK(k) is maintained at a high voltage level. In particular, as indicated in a shaded manner in FIG. 8, for the period P8 to P9, the scan clock signal SCCLK(i), the scan clock signal SCCLK(i+1), the scan clock signal SCCLK(i+2), the scan clock signal SCCLK(i+3) and the carry clock signal CRCLK(k) are maintained at a high voltage level. Accordingly, for the period P8 to P9, the voltage level of the Q node rises rapidly from the third boosting voltage BL3 level to the fifth boosting voltage BL5 level.

Subsequently, for the period P9 to P10, the period P10 to P11, and the period P11 to P12, the voltage level of the Q node is sequentially lowered to the fourth boosting voltage BL4 level, and then to the third boosting voltage level BL3, and then to the second boosting voltage level BL2, respectively.

However, for the period P12 to P13, when the j-th scan clock signal (e.g., the scan clock signal SCCLK(i+3)) and the carry clock signal CRCLK(k) are simultaneously lowered to a low voltage level, the voltage level of the Q node is abruptly lowered from the second boosting voltage BL2 level to the first high-potential voltage GVDD1 level.

Eventually, according to FIG. 9, for a period from a falling edge timing P9 of the gate signal SCOUT(i) to a next time-point P10, the voltage level of the Q node relatively gently decreases from the fifth boosting voltage BL5 level to the fourth boosting voltage BL4 level, whereas, for a period from a falling edge timing P12 of the gate signal SCOUT(i+3) to a next time-point P13, the voltage level of the Q node rapidly decreases from the second boosting voltage BL2 level to the first high-potential voltage GVDD1 level. Accordingly, a difference between a falling time of the gate signal SCOUT(i) and a falling time of the gate signal SCOUT(i+3) becomes larger.

Exemplary falling times of the first gate signal SCOUT(i) and the j-th gate signal SCOUT(i+3) as measured while actually operating the stage circuit shown in FIG. 7 according to the aspect of FIG. 8 are as follows.

SCOUT(i): 0.748 µs
SCOUT(i+3): 0.816 µs

In this example, the difference between the falling time of the first gate signal SCOUT(i) and the falling time of the j-th gate signal SCOUT(i+3) is 0.068 µs. The difference between the falling time of the first gate signal SCOUT(i) and the falling time of the j-th gate signal SCOUT(i+3) may be interpreted as an output difference between the gate signal SCOUT(i) and the j-th gate signal SCOUT(i+3).

In this way, when an output difference between the first gate signal (e.g., the gate signal SCOUT(i)) and the j-th gate signal (e.g., the gate signal SCOUT(i+3) among the j gate signals output from one stage circuit occurs, a difference between magnitudes of the data voltages respectively charged to the sub-pixels upon receiving the gate signals may occur. Thus, the image display quality of the display device is deteriorated.

Hereinafter, another aspect in which an output difference between a first gate signal (e.g., a gate signal SCOUT(i)) and a j-th gate signal (e.g., a gate signal SCOUT(i+3)) among j (e.g., four) gate signals output from one stage circuit is reduced is described.

Figure 10:
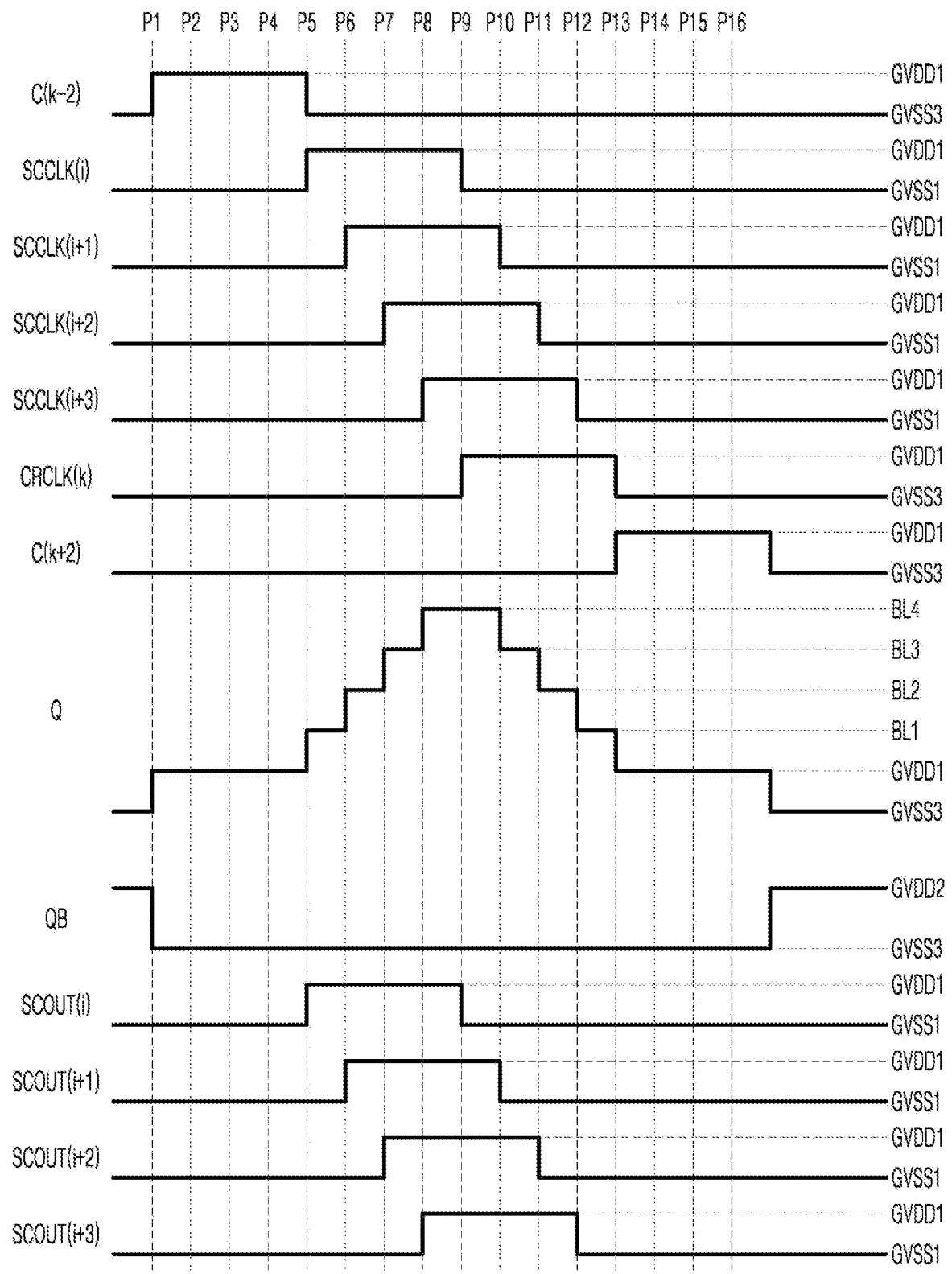
FIG. 10 shows a waveforms of each of an input signal and an output signal when the stage circuit of FIG. 7 outputs a gate signal for image display according to another aspect of the present disclosure.

FIG. 10 shows a waveforms of each of an input signal and an output signal when the stage circuit of FIG. 7 outputs a gate signal for image display, according to another aspect of the present disclosure.

When a high voltage level front carry signal CS1(k−2) is input for a period P1 to P5, the first transistor T21 and the second transistor T22 of the Q node controller 504 are turned on. Accordingly, the Q node has been charged to the first high-potential voltage GVDD1 level. Further, the first transistor T51 of the QB node stabilizer 510 is turned on based on the high voltage level front carry signal CS1(k−2), such that the QB node is discharged to the third low-potential voltage GVSS3 level.

When a high voltage level scan clock signal SCCLK(i) is input for a period P5 to P6, the boosting capacitor CS1 bootstraps the voltage of the Q node to the first boosting voltage BL1 level higher than the first high-potential voltage GVDD1 level. Accordingly, the gate signal SCOUT(i) is output from the second output node NO2 for the period P5 to P6.

When a high voltage level scan clock signal SCCLK(i+1) together with a high voltage level scan clock signal SCCLK(i) are input for a period P6 to P7, the boosting capacitors CS1 and CS2 bootstrap the voltage of the Q node to the second boosting voltage BL2 level which is higher than the first boosting voltage BL1 level. Accordingly, the gate signal SCOUT(i+1) is output from the third output node NO3 for the period P6 to P7.

When a high voltage level scan clock signal SCCLK(i), a high voltage level scan clock signal SCCLK(i+1), and a high voltage level scan clock signal SCCLK(i+2) are input for a period P7 to P8, the boosting capacitors CS1, CS2, and CS3 bootstrap the voltage of the Q node to the third boosting voltage BL3 level which is higher than the second boosting voltage BL2 level. Accordingly, the gate signal SCOUT(i+2) is output from the fourth output node NO4 for the period P7 to P8.

For a period P8 to P9, a high voltage level scan clock signal SCCLK(i+3) together with a high voltage level scan clock signal SCCLK(i), a high voltage level scan clock signal SCCLK(i+1), and a high voltage level scan clock signal SCCLK(i+2) are input.

In one example, in the aspect of FIG. 10, for the period P8 to P9, the carry clock signal CRCLK(k) is not input. That is, for the period P8 to P9, the voltage level of the carry clock signal CRCLK(k) is maintained at a low voltage level.

In the aspect of FIG. 10, a rising edge timing P9 of the carry clock signal CRCLK(k) is set to be the same as a falling edge timing P9 of the scan clock signal SCCLK(i). However, in another aspect of the present disclosure, a rising edge timing of the carry clock signal CRCLK(k) may be set to be later than a falling edge timing of the scan clock signal SCCLK(i). For example, in another aspect of the present disclosure, the rising edge timing of the carry clock signal CRCLK(k) may be set to a time-point P10 rather than a time-point P9.

Further, in the aspect of FIG. 10, a rising edge timing P9 of the carry clock signal CRCLK(k) may be set to be later than a rising edge timing P8 of the scan clock signal SCCLK(i+3). In another aspect of the present disclosure, the rising edge timing of the carry clock signal CRCLK(k) may be set to the time-point P10 rather than the time-point P9.

Further, in the aspect of FIG. 10, a falling edge timing P13 of the carry clock signal CRCLK(k) may be set to be later than a falling edge timing P12 of the scan clock signal SCCLK(i+3). In another aspect of the present disclosure, the rising edge timing of the carry clock signal CRCLK(k) may be set to a time-point P14 rather than a time-point P13.

Eventually, according to another aspect of the present disclosure, a high voltage level period (P9 to P13) of the carry clock signal CRCLK(k) and a high voltage level period (P5 to P9) of the first scan clock signal (e.g., the scan clock signal SCCLK(i)) do not overlap each other. In accordance with the present disclosure, a case in which the high voltage level period (P9 to P13) of the carry clock signal CRCLK(k) and the high voltage level period (P5 to P9) of the first scan clock signal (e.g., the scan clock signal SCCLK(i)) do not overlap each other may include both of a case in which the rising edge timing of the carry clock signal CRCLK(k) is later than the falling edge timing of the scan clock signal SCCLK(i) and a case in which the rising edge timing P9 of the carry clock signal CRCLK(k) is identical with the falling edge timing P9 of the scan clock signal SCCLK(i).

Further, according to another aspect of the present disclosure, a partial period P9 to P12 of the high voltage level period of the carry clock signal CRCLK(k) and a partial period P9 to P12 of the high voltage level period of the j-th scan clock signal (e.g., the scan clock signal SCCLK(i+3)) overlap each other.

Accordingly, for the period P8 to P9, the boosting capacitors CS1, CS2, CS3, and CS4 bootstrap the voltage of the Q node to the fourth boosting voltage BL4 level. Accordingly, the gate signal SCOUT(i+3) is output from the fifth output node NO5 for the period P8 to P9.

For a period P9 to P10, a high voltage level scan clock signal SCCLK(i+1), a high voltage level scan clock signal SCCLK(i+2), a high voltage level scan clock signal SCCLK(i+3), and a high voltage level carry clock signal CRCLK(k) are input. Therefore, for the period P9 to P10, the boosting capacitors CC, CS2, CS3, and CS4 bootstrap the voltage of the Q node to the fourth boosting voltage BL4 level. Further, for the period P9 to P10, a voltage level of each of the scan clock signal SCCLK(i) and the gate signal SCOUT(i) is lowered to a low voltage level.

For a period P10 to P11, a high voltage level scan clock signal SCCLK(i+2), a high voltage level scan clock signal SCCLK(i+3) and a high voltage level carry clock signal CRCLK(k) are input. Therefore, the boosting capacitors CC, CS3, and CS4 bootstrap the voltage of the Q node to the third boosting voltage BL3 level lower than the fourth boosting voltage BL4 level. Further, for the period P10 to P11, a voltage level of each of the scan clock signal SCCLK(i+1) and the gate signal SCOUT(i+1) is lowered to a low voltage level.

For a period P11 to P12, a high voltage level scan clock signal SCCLK(i+3) and a high voltage level carry clock signal CRCLK(k) are input. Therefore, the boosting capacitors CC and CS4 bootstrap the voltage of the Q node to the second boosting voltage BL2 level lower than the third boosting voltage BL3 level. Further, for the period P11 to P12, a voltage level of each of the scan clock signal SCCLK(i+2) and the gate signal SCOUT(i+2) is lowered to a low voltage level.

For a period P12 to 13, only a high voltage level carry clock signal CRCLK(k) is input. Accordingly, for the period P12 to 13, the voltage of the Q node is lowered to the first boosting voltage BL1 level. Further, for the period P12 to 13, a voltage level of each of the scan clock signal SCCLK (i+3) and the gate signal SCOUT(i+3) is lowered to a low voltage level.

Although not shown, when a high voltage level carry clock signal CRCLK(k) is input for the period P13 to P17, the carry signal C(k) is output from the first output node NO1 via the first transistor T81 which has been turned on based on a voltage charged to the Q node.

When a high voltage level rear carry signal CS2(k+2) is input for a period P13 to P17, the third transistor T23 and the fourth transistor T24 of the Q node controller 504 are turned on. Accordingly, the Q node is discharged to the third low-potential voltage GVSS3 level at a time-point P16. When the Q node has been discharged to the third low-potential voltage GVSS3 level, the fourth transistor T44 included in the inverter 508 is turned off. The second high-potential voltage GVDD2 is input to a gate of the first transistor T41, such that the first transistor T41 is turned on. When the first transistor T41 is turned on, the QB node is charged to the second high-potential voltage GVDD2 level.

Figure 11:
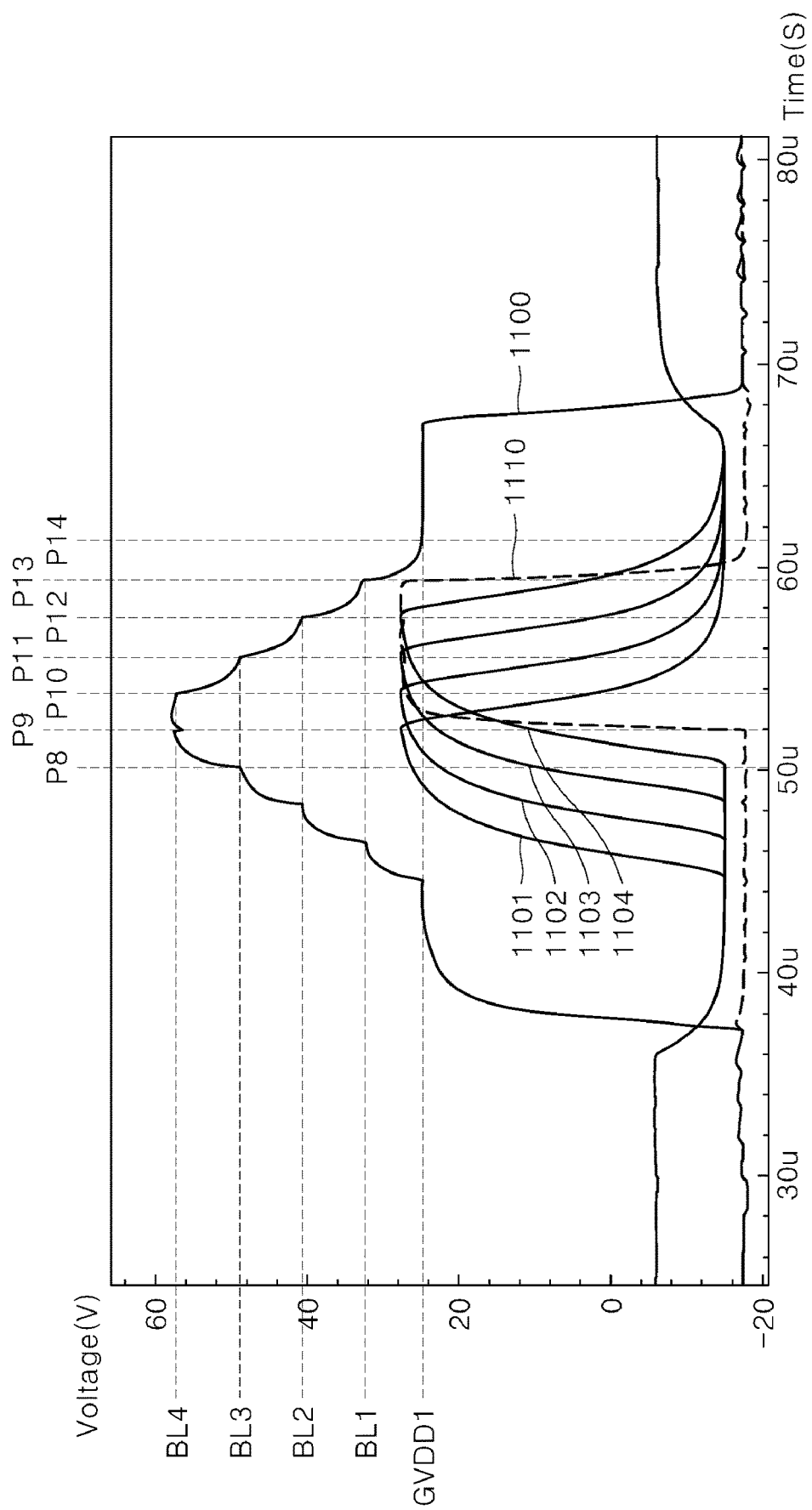
FIG. 11 shows a waveform of a voltage of a Q node, a voltage waveform of a carry clock signal, and voltage waveforms of gate signals when the gate signals for image display are output from the stage circuit of FIG. 7 and according to one aspect of FIG. 10.

FIG. 11 shows a waveform of a voltage of a Q node, a voltage waveform of a carry clock signal, and voltage waveforms of gate signals when the gate signals for image display are output from the stage circuit of FIG. 7 and according to one aspect of FIG. 10.

FIG. 11 shows a voltage waveform 1100 of the Q node, a voltage waveform 1101 of the gate signal SCOUT(i), a voltage waveform 1102 of the gate signal SCOUT(i+1), a voltage waveform 1102 of the gate signal SCOUT(i+1), a voltage waveform 1103 of the gate signal SCOUT(i+2), a voltage waveform 1104 of the gate signal SCOUT(i+3), and a voltage waveform 1110 of the carry clock signal CRCLK (k), among waveforms of the signals shown in FIG. 10.

As described above, in the aspect of FIG. 10, the high voltage level period P9 to P13 of the carry clock signal CRCLK(k) and the high voltage level period P5 to P9 of the first scan clock signal (e.g., the scan clock signal SCCLK(i)) do not overlap each other. Therefore, for the period P8 to P9 for which all of the gate signal SCOUT(i), the gate signal SCOUT(i+1), the gate signal SCOUT(i+2), and the gate signal SCOUT(i+3) are output, the voltage waveform 910 of the carry clock signal CRCLK(k) is maintained at a low voltage level.

Accordingly, for the period P8 to P9, the voltage level of the Q node rises from the third boosting voltage level BL3 to the fourth boosting voltage BL5 level.

Subsequently, for the period P9 to P10, the voltage level of the Q node is maintained at the fourth boosting voltage BL4 level. Further, for the period P10 to P11 and period P11 to P12, the voltage level of the Q node is sequentially lowered to the third boosting voltage level BL3, and then to the second boosting voltage level BL2, respectively.

In one example, for a period P12 to P13, the j-th scan clock signal (e.g., the scan clock signal SCCLK(i+3)) is maintained at a low voltage level, while the carry clock signal CRCLK(k) is maintained at a high voltage level. Accordingly, the voltage level of the Q node is abruptly lowered from the second boosting voltage BL2 level to the first boosting voltage BL1 level.

Eventually, according to FIG. 11, for a period from the falling edge timing P9 of the gate signal SCOUT(i) to a next time-point P10, the voltage level of the Q node is maintained at the fourth boosting voltage BL4 level, whereas for a period from the falling edge timing P12 of the gate signal SCOUT(i+3) to a next time-point P13, the voltage level of the Q node is gently lowered from the second boosting voltage BL2 level to the first boosting voltage BL1 level. Accordingly, a difference between the falling time of the gate signal SCOUT(i) and the falling time of the gate signal SCOUT(i+3) is reduced, compared to that in the aspect of FIG. 8.

Exemplary falling times of the first gate signal (e.g., SCOUT(i)) and the j-th gate signal (e.g., SCOUT(i+3)) as measured while actually operating the stage circuit shown in FIG. 7 according to the aspect of FIG. 10 are as follows.

SCOUT(i): 0.751 μs
SCOUT(i+3): 0.794 μs

According to the measurement result, for a period from the falling edge timing P12 of the j-th gate signal (e.g., the gate signal SCOUT(i+3)) to the next time-point P13, the voltage level of the Q node gradually decreases from the second boosting voltage BL2 level to the first boosting voltage BL1 level. Thus, the falling time of the j-th gate signal (e.g., SCOUT(i+3)) is reduced, compared to that in the aspect of FIG. 8.

In this example, the difference between the falling time of the first gate signal SCOUT(i) and the falling time of the j-th gate signal SCOUT(i+3) is 0.043 μs. This difference 0.043 μs is a value reduced by 35% compared to 0.068 μs which is the difference between the falling time of the first gate signal (e.g., SCOUT(i)) and the falling time of the j-th gate signal (e.g., SCOUT(i+3)) when the stage circuit shown in FIG. 7 operates according to the aspect of FIG. 8.

That is, when the stage circuit of FIG. 7 operates according to the aspect shown in FIG. 10, the output difference between the first gate signal (e.g., SCOUT(i)) and the j-th gate signal (e.g., SCOUT(i+3)) is reduced, compared to that in the aspect shown in FIG. 8. Due to the reduction of the output difference between the first gate signal (e.g., SCOUT (i)) and the j-th gate signal (e.g., SCOUT(i+3)), the output difference between the gate signals output from the gate driver circuit may be reduced. Accordingly, the image display quality of the display device may be improved.

Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. the scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A gate driver circuit for a display device, wherein the gate driver circuit comprises a plurality of stage circuits,
    wherein each stage circuit supplies a gate signal to each gate line, and includes a M node, a Q node, a QH node, and a QB node,
    wherein each stage circuit includes:
    a line selector configured to:
        operate in response to an input of a line sensing preparation signal to charge the M node based on a front carry signal; and
        operate in response to an input of a reset signal to charge the Q node to a first high-potential voltage level; or
        operate in response to an input of a panel on signal to discharges the Q node to a third low-potential voltage level;
    a Q node controller configured to:
        operate in response to an input of the front carry signal to charge the Q node to the first high-potential voltage level; and
        operate in response to an input of a rear carry signal to discharge the Q node to the third low-potential voltage level;
    a Q node and QH node stabilizer configured to discharge each of the Q node and the QH node to the third low-potential voltage level when the QB node has been charged to a second high-potential voltage level;
    an inverter configured to change a voltage level of the QB node based on a voltage level of the Q node;
    a QB node stabilizer configured to operate in response to an input of the rear carry signal, to an input of the reset signal, and to a charged voltage of the M node to discharge the QB node to a fourth low-potential voltage level;
    a carry signal output module configured to operate based on the voltage level of the Q node or the voltage level of the QB node to output a carry signal based on a carry clock signal or the third low-potential voltage; and
    a gate signal output module configured to operate based on the voltage level of the Q node or the voltage level of the QB node to output first to j-th gate signals based on first to j-th scan clock signals or a first low-potential voltage,
    wherein a high voltage level period of the carry clock signal is set not to overlap with a high voltage level period of the first scan clock signal.

2. The gate driver circuit of claim 1, wherein a rising edge timing of the carry clock signal is set to be the same as or later than a falling edge timing of the first scan clock signal.

3. The gate driver circuit of claim 1, wherein a rising edge timing of the carry clock signal is set to be later than a rising edge timing of a j-th scan clock signal.

4. The gate driver circuit of claim 3, wherein a falling edge timing of the carry clock signal is set to be later than a falling edge timing of the j-th scan clock signal.

5. The gate driver circuit of claim 1, wherein the high voltage level period of the carry clock signal is set to overlap with a high voltage level period of a j-th scan clock signal.

6. A display device comprising:
    a display panel including sub-pixels disposed at intersections between gate lines and data lines;
    a gate driver circuit configured to supply a scan signal to each gate line;
    a data driver circuit configured to supply a data voltage to each data line; and
    a timing controller configured to control an operation of each of the gate driver circuit and the data driver circuit,
    wherein the gate driver circuit includes a plurality of stage circuits,
    wherein each stage circuit supplies a gate signal to each gate line, and includes a M node, a Q node, a QH node, and a QB node,
    wherein each stage circuit includes:
    a line selector configured to:
        operate in response to an input of a line sensing preparation signal to charge the M node based on a front carry signal; and
        operate in response to an input of a reset signal to charge the Q node to a first high-potential voltage level; or
        operate in response to an input of a panel on signal to discharges the Q node to a third low-potential voltage level;
    a Q node controller configured to:
        operate in response to an input of the front carry signal to charge the Q node to the first high-potential voltage level; and
        operate in response to an input of a rear carry signal to discharge the Q node to the third low-potential voltage level;
    a Q node and QH node stabilizer configured to discharge each of the Q node and the QH node to the third low-potential voltage level when the QB node has been charged to a second high-potential voltage level;
    an inverter configured to change a voltage level of the QB node based on a voltage level of the Q node;
    a QB node stabilizer configured to operate in response to an input of the rear carry signal, to an input of the reset signal, and to a charged voltage of the M node to discharge the QB node to a fourth low-potential voltage level;
    a carry signal output module configured to operate based on the voltage level of the Q node or the voltage level of the QB node to output a carry signal based on a carry clock signal or the third low-potential voltage; and
    a gate signal output module configured to operate based on the voltage level of the Q node or the voltage level of the QB node to output first to j-th gate signals based on first to j-th scan clock signals or a first low-potential voltage,
    wherein a high voltage level period of the carry clock signal is set not to overlap with a high voltage level period of the first scan clock signal.

7. The device of claim 6, wherein a rising edge timing of the carry clock signal is set to be the same as or later than a falling edge timing of the first scan clock signal.

8. The device of claim 6, wherein a rising edge timing of the carry clock signal is set to be later than a rising edge timing of a j-th scan clock signal.

9. The device of claim 8, wherein a falling edge timing of the carry clock signal is set to be later than a falling edge timing of the j-th scan clock signal.

10. The device of claim 6, wherein the high voltage level period of the carry clock signal is set to overlap with a high voltage level period of a j-th scan clock signal.

11. A stage circuit of a gate driver circuit for a display device that supplies a gate signal to a plurality of gate lines, comprising:
- a line selector including 1st to 7th transistors and a pre-charging capacitor and configured to charge an M node based on a front carry signal, to charge a Q node to a first high-potential voltage level, and to discharge or reset the Q node to a third low-potential voltage level;
- a Q node controller including 8th to 15th transistors and configured to charge the Q node to the first high-potential voltage level and to discharge the Q node to the third low-potential voltage level;
- a Q node and QH node stabilizer including 16th and 17th transistors and configured to discharge each of the Q node and a QH node to the third low-potential voltage level;
- an inverter including 18th to 22nd transistors and configured to change a voltage level of the QB node based on a voltage level of the Q node;
- a QB node stabilizer including 23rd to 25th transistors and configured to discharge the QB node to a fourth low-potential voltage level;
- a carry signal output module including 26th and 27th transistors and a 1st boosting capacitance and configured to output a carry signal based on a carry clock signal or the third low-potential voltage; and
- a gate signal output module including 28th to 35th transistors and a 2nd boosting capacitance and configured to output first to j-th gate signals based on first to j-th scan clock signals or a first low-potential voltage, wherein a high voltage level period of the carry clock signal does not overlap with a high voltage level period of the first scan clock signal.

12. The device of claim 11, wherein the M node is charged in response to an input of a line sensing preparation signal, the Q node is charged in response to an input of a reset signal, and the Q node is discharge or reset in response to an input of a panel on signal.

13. The device of claim 11, wherein the Q node is charged in response to an input of the front carry signal and the Q node is discharged in response to an input of a rear carry signal.

14. The device of claim 11, wherein the Q node and a QH node are charged when a QB node is charged to a second high-potential voltage level.

15. The device of claim 11, wherein the QB node is discharged in response to an input of the rear carry signal, to an input of the reset signal, and to a charged voltage of the M node.

16. The device of claim 11, wherein the carry signal output module is operated based on the voltage level of the Q node or the voltage level of the QB node.

17. The device of claim 11, wherein the gate signal output module is operated based on the voltage level of the Q node or the voltage level of the QB node.

* * * * *